(12) United States Patent
Saitoh et al.

(10) Patent No.: US 10,096,629 B2
(45) Date of Patent: Oct. 9, 2018

(54) SEMICONDUCTOR DEVICE AND METHOD FOR MANUFACTURING SAME

(71) Applicant: Sharp Kabushiki Kaisha, Sakai, Osaka (JP)

(72) Inventors: Takao Saitoh, Sakai (JP); Seiji Kaneko, Sakai (JP); Yutaka Takamaru, Sakai (JP); Yohsuke Kanzaki, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/576,313

(22) PCT Filed: Jun. 2, 2016

(86) PCT No.: PCT/JP2016/066478
§ 371 (c)(1),
(2) Date: Nov. 22, 2017

(87) PCT Pub. No.: WO2016/199680
PCT Pub. Date: Dec. 15, 2016

(65) Prior Publication Data
US 2018/0151595 A1 May 31, 2018

(30) Foreign Application Priority Data
Jun. 8, 2015 (JP) .................. 2015-115945

(51) Int. Cl.
*H01L 29/10* (2006.01)
*H01L 27/12* (2006.01)
(Continued)

(52) U.S. Cl.
CPC .......... *H01L 27/127* (2013.01); *G02F 1/1343* (2013.01); *G02F 1/1368* (2013.01);
(Continued)

(58) Field of Classification Search
CPC . H01L 27/127; H01L 28/65; H01L 29/78696; H01L 29/7869; H01L 27/1255; H01L 27/1225; H01L 29/24; G02F 1/1368
See application file for complete search history.

(56) References Cited

U.S. PATENT DOCUMENTS

| 2003/0047785 A1 | 3/2003 | Kawasaki et al. |
| 2008/0035920 A1 | 2/2008 | Takechi et al. |

(Continued)

FOREIGN PATENT DOCUMENTS

| JP | 2003-86808 A | 3/2003 |
| JP | 2008-40343 A | 2/2008 |

(Continued)

OTHER PUBLICATIONS

Official Communication issued in International Patent Application No. PCT/JP2016/066478, dated Aug. 23, 2016.

*Primary Examiner* — Mohsen Ahmadi
*Assistant Examiner* — Wasiul Haider
(74) *Attorney, Agent, or Firm* — Keating & Bennett, LLP

(57) ABSTRACT

A semiconductor device (1001) includes a thin-film transistor (101) including a gate electrode (3), an oxide semiconductor layer (7), a gate insulating layer (5), a source electrode (9s), and a drain electrode (9d); a metal oxide layer (8) including a conductor region (70c) and formed from an oxide film from which the oxide semiconductor layer (7) is also formed; an interlayer insulating layer (13) covering the thin-film transistor and the metal oxide layer (8); and a transparent conductive layer (15) disposed on the interlayer insulating layer and electrically connected to the drain electrode, wherein the oxide semiconductor layer (7) and the metal oxide layer (8) contain indium, tin, and zinc, and the (Continued)

transparent conductive layer (15) overlaps at least a portion of the conductor region (70c) with the interlayer insulating layer (13) therebetween.

19 Claims, 18 Drawing Sheets

(51) Int. Cl.
    *G02F 1/1343*     (2006.01)
    *G02F 1/1368*     (2006.01)
    *G09F 9/30*     (2006.01)
    *H01L 29/786*     (2006.01)
    *H01L 49/02*     (2006.01)
    *H01L 29/24*     (2006.01)

(52) U.S. Cl.
    CPC ............ *G09F 9/30* (2013.01); *H01L 27/1225* (2013.01); *H01L 27/1255* (2013.01); *H01L 28/65* (2013.01); *H01L 29/24* (2013.01); *H01L 29/786* (2013.01); *H01L 29/7869* (2013.01); *H01L 29/78696* (2013.01)

(56) References Cited

U.S. PATENT DOCUMENTS

| | | | |
|---|---|---|---|
| 2009/0141203 A1* | 6/2009 | Son | G02F 1/136213 349/39 |
| 2012/0188814 A1* | 7/2012 | Yamazaki | G11C 11/404 365/149 |
| 2013/0126859 A1* | 5/2013 | Yeh | H01L 29/7869 257/43 |
| 2014/0070209 A1 | 3/2014 | Yamazaki et al. | |
| 2014/0084287 A1* | 3/2014 | Yamazaki | H01L 29/78696 257/43 |
| 2014/0253533 A1 | 9/2014 | Miyake | |
| 2015/0129867 A1 | 5/2015 | Takamaru et al. | |
| 2016/0380006 A1 | 12/2016 | Uchida | |

FOREIGN PATENT DOCUMENTS

| | | |
|---|---|---|
| JP | 2014-197184 A | 10/2014 |
| JP | 2014-199406 A | 10/2014 |
| WO | 2013/183495 A1 | 12/2013 |
| WO | 2015/087586 A1 | 6/2015 |

\* cited by examiner

SEMICONDUCTOR DEVICE AND METHOD FOR MANUFACTURING SAME

TECHNICAL FIELD

The present invention relates to a semiconductor device including an oxide semiconductor and a method for manufacturing the semiconductor device.

BACKGROUND ART

Active matrix substrates used for liquid crystal display apparatuses and the like include, for each pixel, a switching element such as a thin-film transistor (hereafter, "TFT"). As such switching elements, TFTs including an amorphous silicon film as an active layer (hereafter, "amorphous silicon TFTs") and TFTs including a polycrystalline silicon film as an active layer (hereafter, "polycrystalline silicon TFTs") have been widely used.

In recent years, as the material for the active layers of TFTs, use of oxide semiconductors instead of amorphous silicon and polycrystalline silicon has been proposed. Such TFTs are referred to as "oxide semiconductor TFTs". Oxide semiconductors have a high mobility than amorphous silicon. Thus, oxide semiconductor TFTs can operate at a higher speed than amorphous silicon TFTs. In addition, oxide semiconductor films are formed by a process simpler than that for polycrystalline silicon films, hence are also applicable to apparatuses required to have such films having a large area. An active matrix substrate including an oxide semiconductor TFT (hereafter, a "TFT substrate") is disclosed in Patent Literature 1, for example.

When the existing TFT substrate disclosed in Patent Literature 1 is used for a liquid crystal display apparatus, the TFT substrate is provided so as to include storage capacitors as necessary. Such a storage capacitor can be constituted by a storage capacitor electrode (or a storage capacitor wiring), a pixel electrode, and a dielectric layer positioned therebetween. The storage capacitor electrode is formed from, for example, a conductive film from which the gate wiring is also formed.

On the other hand, for example, Patent Literatures 2 and 3 disclose that a decrease in the resistance of an oxide semiconductor film is caused, to thereby collectively form a pixel electrode and a semiconductor layer serving as the active layer of a TFT.

CITATION LIST

Patent Literature

PTL 1: Japanese Unexamined Patent Application Publication No. 2003-86808
PTL 2: Japanese Unexamined Patent Application Publication No. 2008-40343
PTL 3: International Publication No. 2013/183495

SUMMARY OF INVENTION

Technical Problem

In the case where a TFT substrate is provided so as to include storage capacitors, the above-described formation of storage capacitor electrodes from a conductive film (normally, a metal film) from which a gate wiring is also formed does not complicate the production process and enables formation of a storage capacitor within each pixel. However, the area for the storage capacitor electrodes causes a decrease in the aperture ratio and light transmittance, which is problematic.

Under the above-described circumstances, the present invention has been made. An object of an embodiment of the present invention is to provide a semiconductor device that enables a high aperture ratio and a high transmittance.

Solution to Problem

A semiconductor device according to an embodiment of the present invention includes a substrate; a thin-film transistor supported by the substrate and including a gate electrode, an oxide semiconductor layer, a gate insulating layer positioned between the gate electrode and the oxide semiconductor layer, and a source electrode and a drain electrode that are electrically connected to the oxide semiconductor layer; a metal oxide layer including a conductor region, and formed from an oxide film from which the oxide semiconductor layer is also formed; an interlayer insulating layer covering the thin-film transistor and the metal oxide layer; and a transparent conductive layer disposed on the interlayer insulating layer and electrically connected to the drain electrode, wherein the oxide semiconductor layer and the metal oxide layer contain indium, tin, and zinc, and the transparent conductive layer overlaps at least a portion of the conductor region with the interlayer insulating layer therebetween.

In an embodiment, the interlayer insulating layer includes a first insulating film covering the thin-film transistor and the metal oxide layer, and having an opening above the conductor region of the metal oxide layer, and a second insulating film formed on the first insulating film and within the opening, and being in contact with, within the opening, the conductor region of the metal oxide layer, and the transparent conductive layer overlaps the at least a portion of the conductor region with the second insulating film therebetween.

In an embodiment, the insulating film is a reducing insulating film having a property of reducing an oxide semiconductor contained in the oxide semiconductor layer.

The first insulating film may include an organic insulating film.

In an embodiment, the gate electrode is disposed on a side of the oxide semiconductor layer, the side being closer to the substrate, and the oxide semiconductor layer has a multilayer structure including a first semiconductor layer containing indium, tin, and zinc, and a second semiconductor layer formed on the first semiconductor layer and containing indium and gallium.

In an embodiment, the metal oxide layer includes a first oxide layer formed from an oxide film from which the first semiconductor layer is also formed, and the second insulating film is in contact with, within the opening, the first oxide layer.

In an embodiment, the at least a portion of the metal oxide layer has a multilayer structure including a first oxide layer formed from an oxide film from which the first semiconductor layer is also formed, and a second oxide layer formed from an oxide film from which the second semiconductor layer is also formed, and the conductor region is formed in at least a portion of the first oxide layer and in at least a portion of the second oxide layer.

In an embodiment, the gate electrode is disposed on a side of the oxide semiconductor layer, the side being closer to the substrate, the oxide semiconductor layer is constituted solely by a first semiconductor layer containing indium, tin, and zinc, and the metal oxide layer is constituted solely by a first oxide layer formed from an oxide film from which the first semiconductor layer is also formed.

In an embodiment, the semiconductor device further includes another thin-film transistor, the other thin-film transistor including an active layer having a multilayer structure including a first layer formed from an oxide film from which the first semiconductor layer is also formed and a second layer formed on the first layer and containing indium and gallium but not containing tin.

The conductor region may have a sheet resistance of 200Ω/□ or less.

In an embodiment, the metal oxide layer further includes a semiconductor region, and the semiconductor region is positioned on a periphery of the metal oxide layer.

In an embodiment, the oxide semiconductor layer and the metal oxide layer contain an In—Sn—Zn—O-based oxide.

In an embodiment, the oxide semiconductor layer and the metal oxide layer contain a crystalline portion.

In an embodiment, the first semiconductor layer contains an In—Sn—Zn—O-based oxide, and the second semiconductor layer contains an In—Ga—Zn—O-based oxide.

A method for manufacturing a semiconductor device according to an embodiment of the present invention is a method for manufacturing a semiconductor device including a substrate, a thin-film transistor supported by the substrate, and a capacitive element, the method including (a) a step of forming, on the substrate, a gate electrode and a gate insulating layer covering the gate electrode; (b) a step of forming, on the gate insulating layer, an oxide semiconductor film containing indium, tin, and zinc and patterning the oxide semiconductor film to form an active-layer-formation oxide semiconductor layer and an electrode-formation oxide semiconductor layer such that the active-layer-formation oxide semiconductor layer is disposed so as to have at least a portion overlapping the gate electrode with the gate insulating layer therebetween; (c) a step of forming a source electrode and a drain electrode that are in contact with the active-layer-formation oxide semiconductor layer; (d) a step of forming a first insulating film so as to cover the source electrode, the drain electrode, and the electrode-formation oxide semiconductor layer, and forming, in the first insulating film, a first opening through which a portion of the drain electrode is exposed, and a second opening through which a portion of the electrode-formation oxide semiconductor layer is exposed; (e) a step of forming, on the first insulating film and within the first and second openings, a second insulating film having a property of reducing an oxide semiconductor contained in the electrode-formation oxide semiconductor layer, to cause a decrease in a resistance of a portion of the electrode-formation oxide semiconductor layer, the portion being in contact with the second insulating film within the second opening, to form a conductor region while a portion of the electrode-formation oxide semiconductor layer, the portion not being turned into a conductor, remains as a semiconductor region; (f) a step of removing a portion of the second insulating film, the portion being positioned within the first opening, to form a contact hole that extends through the first and second insulating films and through which the drain electrode is exposed; and (g) a step of forming a transparent conductive layer on the second insulating film and within the contact hole such that the transparent conductive layer is in contact with the drain electrode within the contact hole and overlaps at least a portion of the conductor region with the second insulating film therebetween.

In an embodiment, the step (b) includes a step (b1) of stacking a first semiconductor film containing indium, tin, and zinc, and, on the first semiconductor film, a second semiconductor film containing indium and gallium but not containing tin to obtain an oxide semiconductor film having a multilayer structure.

In an embodiment, the step (b) includes a first patterning step (b2) of patterning, after the step (b1), only the second semiconductor film out of the oxide semiconductor film; and a second patterning step (b3) of patterning, after the step (b2), the first and second semiconductor films simultaneously.

In an embodiment, an etchant used in the step (b2) is phosphoric acid-nitric acid-acetic acid, and an etchant used in the step (b3) is oxalic acid.

In an embodiment, the electrode-formation oxide semiconductor layer is formed solely from the first semiconductor film, and the active-layer-formation oxide semiconductor layer is formed from the first and second semiconductor films.

In an embodiment, the oxide semiconductor film contains an In—Sn—Zn—O-based oxide.

In an embodiment, the oxide semiconductor film contains a crystalline portion.

Advantageous Effects of Invention

Embodiments according to the present invention can provide semiconductor devices including oxide semiconductor TFTs that enable high aperture ratios and high transmittances.

BRIEF DESCRIPTION OF DRAWINGS

FIG. 10 is an Ellingham diagram illustrating the temperature dependence of standard Gibbs energy of formation in terms of oxides of Si, Ga, Sn, and In.

DESCRIPTION OF EMBODIMENTS

Figure 1:
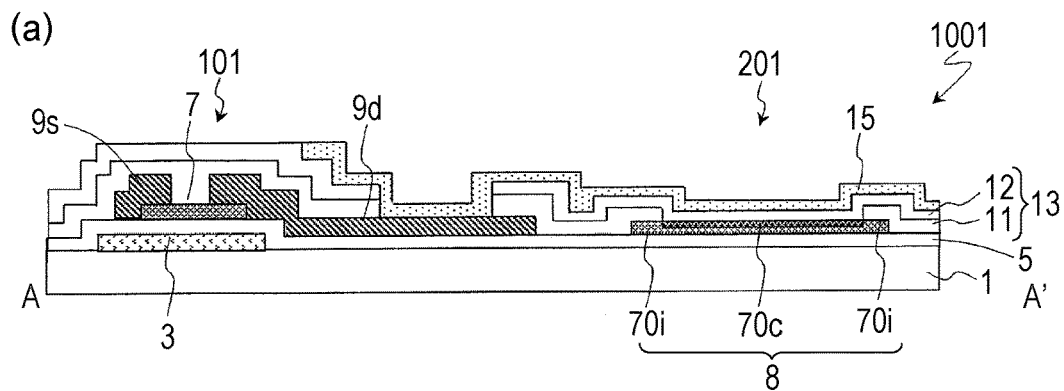
FIG. 1(a) is a sectional view illustrating a TFT 101 and a storage capacitor 201 of a semiconductor device (TFT substrate) 1001 according to a first embodiment.
FIG. 1(b) is a plan view illustrating a portion of the semiconductor device 1001.
Figure 1:
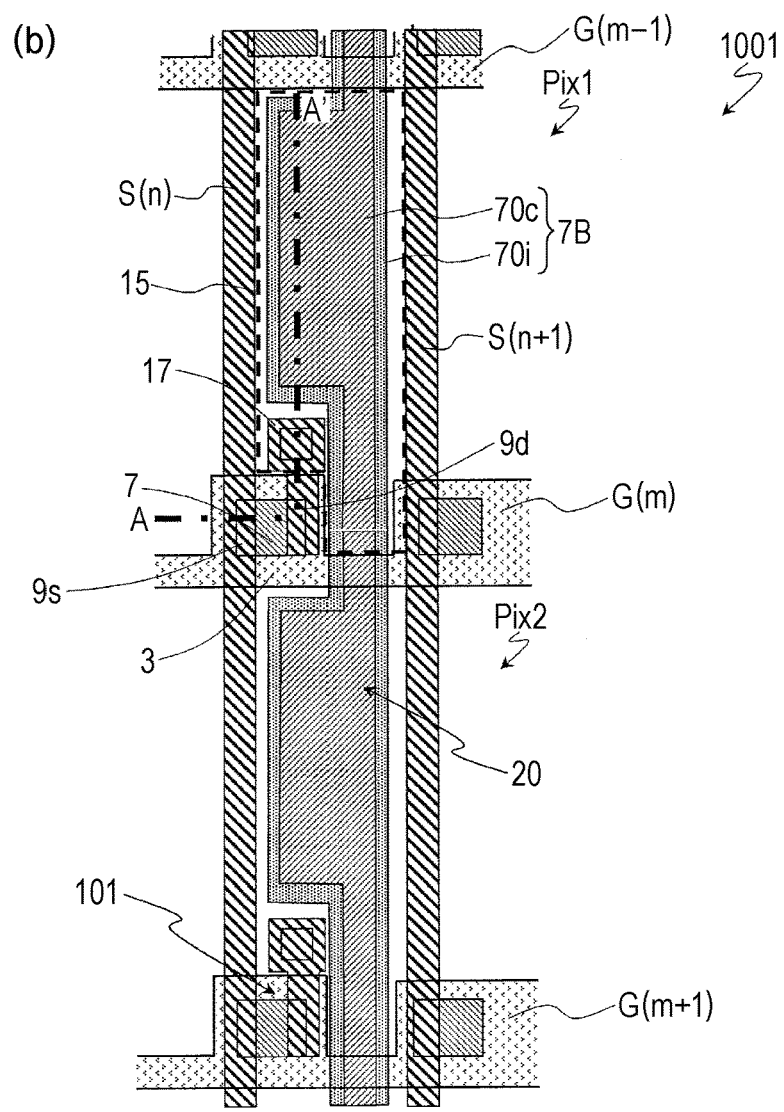

As described above, use of a gate wiring layer as storage capacitor electrodes causes a decrease in the pixel aperture ratio. In order to address this, the inventors of the present invention studied a configuration in which such a storage capacitor electrode is formed by using an oxide film obtained by decreasing the resistance of an oxide semiconductor film. In this configuration, the whole storage capacitor is formed of a transparent material, so that an increase in the pixel aperture ratio is expected, compared with the existing case of using a metal film as a lower-layer electrode. When a reducing insulating film such as a silicon nitride film is used as the dielectric layer of the storage capacitor, a portion of the oxide semiconductor film, the portion being in contact with the insulating film, is reduced to have a decreased resistance. This provides another advantage of enabling omission of the special treatment of decreasing the resistance such as plasma treatment.

However, according to the studies performed by the inventors of the present invention, decreasing the resistance of, for example, an In—Ga—Zn—O-based semiconductor film is sometimes difficult to achieve formation of a storage capacitor electrode that has a sufficiently low electric resistance. Hereinafter, this will be described in detail.

When a reducing insulating film such as a silicon nitride film (SiNx) is formed on an In—Ga—Zn—O-based semiconductor film, the oxide semiconductor contained in the In—Ga—Zn—O-based semiconductor film is reduced to cause a decrease in the resistance, to provide an In—Ga—Zn—O conductor film. In this case, studies on the relationship between the film-formation temperature of the insulating film and the electric resistance of the In—Ga—Zn—O conductor film have revealed that the electric resistance of the In—Ga—Zn—O conductor film considerably varies depending on the film-formation temperature.

Table 1 describes an example of results of experiments performed by the inventors of the present invention. In this example, on an In—Ga—Zn—O-based semiconductor film (In:Ga:Zn=1:1:1), a silicon nitride film (thickness: 50 to 500 nm) serving as an insulating film was formed by a CVD method at a film-formation temperature of 200° C., to achieve a decrease in the resistance of the In—Ga—Zn—O-based semiconductor film, to provide an In—Ga—Zn—O conductor film (conductor film 1). Conductor films 2 to 4 were formed in the same manner as in the conductor film 1 except for the film-formation temperature. Subsequently, the sheet resistances of the conductor films 1 to 4 were measured. Some of the conductor films were measured in terms of surface roughness Ra.

TABLE 1

| Conductor film | Type of oxide semiconductor | Electric resistance of conductor film (Ω/□) | Surface roughness Ra (nm) |
| --- | --- | --- | --- |
| 1 | In—Ga—Zn—O-based semiconductor | 500 | 1.4 |
| 2 | | 220 | |
| 3 | | 210 | |
| 4 | | 230 | 9.4 |
| 5 | In—Sn—Zn—O-based semiconductor | 100 | |
| 6 | | 100 | |
| 7 | | 100 | |
| 8 | | 100 | |

As is understood from Table 1, the higher the film-formation temperature of the insulating film (silicon nitride film), the more the decrease in the electric resistance of the In—Ga—Zn—O conductor film. However, an increase in the film-formation temperature causes an increase in the surface roughness Ra of the In—Ga—Zn—O conductor film, which causes problems such as a decrease in the adhesion between the In—Ga—Zn—O conductor film and the silicon nitride film. This is probably because a high film-formation temperature causes, during formation of the insulating film, an increase in the degree of diffusion of Zn atoms from the In—Ga—Zn—O conductor film to the insulating film, and formation of irregularities tends to occur in the surface of the In—Ga—Zn—O conductor film. In order to prevent this, the film-formation temperature of the insulating film may be set at, for example, about 250° C. or less; in this case, the electric resistance of the In—Ga—Zn—O conductor film is difficult to decrease to a sufficiently low value. In addition, there is a limit to how much the electric resistance of In—Ga—Zn—O conductor films is decreased because of the material, and it is difficult to decrease the electric resistance to 200Ω or less, for example. Thus, when In—Ga—Zn—O-based semiconductor films are used, it is difficult to stably form storage capacitor electrodes having a sufficiently low electric resistance.

Accordingly, the inventors of the present invention performed further studies on an oxide semiconductor in which its electric resistance can be made lower by a treatment of decreasing the resistance. During the studies, the inventors have found that use of an In—Sn—Zn—C-based semiconductor film as an oxide semiconductor film enables formation of a conductor film having a low electric resistance.

Conductor films 5 to 8 were formed from an In—Sn—Zn—O-based semiconductor films (thickness: 5 to 200 nm) in the same manner as in the conductor films 1 to 4. Table 1 also describes the results of measuring the electric resistances of the In—Sn—Zn—O conductor films. As is understood from Table 1, the In—Sn—Zn—O conductor films each have an electric resistance of 100Ω/□ regardless of the film-formation temperatures of the insulating films, which has demonstrated that conductor films having a lower resistance are obtained. In addition, SEM observation results have revealed that an increase in the film-formation temperature of the insulating film causes an increase in the surface roughness of the In—Sn—Zn—O conductor film as in the In—Ga—Zn—O-based semiconductor film.

On the basis of the above-described findings, the inventors of the present invention studied the configuration of a semiconductor device including storage capacitors using an In—Sn—Zn—O conductor film, and have conceived the present invention.

First Embodiment

Hereinafter, a first embodiment according to the present invention will be described with reference to drawings.

FIG. 1(a) is a sectional view illustrating a TFT 101 and a storage capacitor 201 of a semiconductor device (TFT substrate) 1001 according to this embodiment. FIG. 1(b) is a plan view illustrating a portion of the semiconductor device 1001. FIG. 1(a) is a sectional view taken along line A-A' in FIG. 1(b). Incidentally, the "semiconductor device" in this Description denotes devices that include a TFT and a capacitive element and broadly encompasses, for example, TFT substrates and display apparatuses including a TFT substrate.

The semiconductor device 1001 includes the TFT 101, which is supported by a substrate 1, an interlayer insulating layer 13, a transparent conductive layer 15, and the storage capacitor 201. This transparent conductive layer 15 functions as a pixel electrode.

The TFT 101 is a bottom-gate TFT including a gate electrode 3, a gate insulating layer 5, which covers the gate electrode 3, an oxide semiconductor layer 7, which is formed on the gate insulating layer 5, and a source electrode 9s and a drain electrode 9d.

The oxide semiconductor layer 7 contains an oxide semiconductor containing In, Sn, and Zn. The oxide semiconductor layer 7 may be, for example, an In—Sn—Zn—O-based semiconductor layer, or may have a multilayer structure including an In—Sn—Zn—O-based semiconductor layer.

The oxide semiconductor layer 7 is disposed such that at least the channel region overlaps the gate electrode 3 with the gate insulating layer 5 therebetween. In this embodiment, a portion of a gate line G, the portion overlapping the oxide semiconductor layer 7 with the gate insulating layer 5 therebetween, serves as the gate electrode 3. The source and drain electrodes 9s and 9d are electrically connected to both sides of the channel region of the oxide semiconductor layer 7. The source and drain electrodes 9s and 9d may be in a direct contact with the oxide semiconductor layer 7. In this embodiment, a portion of a source line S, the portion being in contact with the oxide semiconductor layer 7, serves as the source electrode 9s. The source electrode 9s is electrically connected to the source line S. The drain electrode 9d is electrically connected to the transparent conductive layer 15 (hereafter, "pixel electrode") 15.

The interlayer insulating layer 13 is disposed so as to cover the TFT 101. In this example, the interlayer insulating layer 13 includes a first insulating film 11 and a second insulating film 12, which is disposed on the first insulating film 11. In this example, the second insulating film 12 also functions as a dielectric layer of the storage capacitor 201. The first insulating film 11 may be a silicon oxide film, for example. The second insulating film 12 may be a silicon nitride film, for example. Incidentally, the interlayer insulating layer 13 is not limited to the above-described bilayer structure, and may have a multilayer structure including three or more layers. The interlayer insulating layer 13 may include an organic insulating film.

The pixel electrode 15 is formed of a transparent conductive material (for example, ITO). The pixel electrode 15 is disposed on the interlayer insulating layer 13, and is electrically connected to, within a contact hole formed in the interlayer insulating layer 13, the drain electrode 9d of the TFT 101.

The storage capacitor 201 includes a metal oxide layer 8, which functions as a lower electrode, the pixel electrode 15, which functions as an upper electrode, and a dielectric layer (here, the second insulating film 12) disposed so as to extend between the metal oxide layer 8 and the pixel electrode 15. In the storage capacitor 201, the pixel electrode 15, which serves as the upper-layer electrode, and the metal oxide layer (conductor region 70c), which serves as the lower-layer electrode, are each formed of a transparent conductive material. Such a storage capacitor is sometimes referred to as a "transparent storage capacitor". The storage capacitor 201 is electrically parallel-connected to a liquid crystal capacitor in a liquid crystal display apparatus, for example.

The metal oxide layer 8 contains an oxide containing In, Sn, and Zn. The metal oxide layer 8 may be formed from an oxide film from which the oxide semiconductor layer 7 is also formed. The metal oxide layer 8 includes a conductor region 70c. The conductor region 70c is a region having a lower resistance than the oxide semiconductor layer 7 of the TFT 101. The conductor region 70c is, for example, an In—Sn—Zn—O conductor region obtained by decreasing the resistance of the oxide semiconductor film. This conductor region 70c is formed in a near-surface portion of the oxide semiconductor layer 7; alternatively, the conductor region 70c may be formed so as to extend in the thickness direction of the oxide semiconductor layer 7. The metal oxide layer 8 may include, in addition to the conductor region 70c, a semiconductor region 70i. As illustrated in FIG. 1(b), the semiconductor region 70i may be positioned in the peripheral portion of the metal oxide layer 8 when viewed in a direction of a line normal to the substrate 1. Incidentally, the planar shapes of the metal oxide layer 8 and the conductor region 70c are not limited to the shapes illustrated in FIG. 1(b). The metal oxide layer 8 and the conductor region 70c may be divided so as to correspond to each pixel.

The pixel electrode 15 is disposed so as to overlap at least a portion of the conductor region 70c of the metal oxide layer 8 with the interlayer insulating layer 13 therebetween. Thus, the storage capacitor 201 is constituted in which the conductor region 70c serves as a lower-layer electrode (also referred to as a storage capacitor wiring or a storage capacitor electrode), the pixel electrode 15 serves as an upper-layer electrode, and a portion of the interlayer insulating layer 13, the portion being positioned between these electrodes, serves as a dielectric layer. In this example, the dielectric layer of the storage capacitor 201 includes the second insulating film 12 and does not include the first insulating film 11. In other words, of the interlayer insulating layer 13, mainly the second insulating film 12 functions as the dielectric layer of the storage capacitor 201.

The first insulating film 11 in this embodiment has an opening above at least a portion of the conductor region 70c of the metal oxide layer 8. In this example, in a portion of the metal oxide layer 8, the portion being exposed through the opening of the first insulating film 11, the conductor region 70c is formed; and, in a portion of the metal oxide layer 8, the portion not being exposed through the opening, the semiconductor region 70i is formed. In the opening of the first insulating film 11, the second insulating film 12 is formed so as to be in contact with the conductor region 70c.

The above-described configuration can be formed by forming, on an oxide film that is to serve as the metal oxide layer 8, a reducing insulating film (for example, a SiNx film) serving as the second insulating film 12, to cause a decrease in the resistance of, in the oxide film, only a portion in contact with the second insulating film 12. Alternatively, the configuration can be formed by subjecting an oxide film that is to serve as the metal oxide layer 8 to, through the first insulating film 11 serving as a mask, a treatment of decreasing the resistance such as plasma treatment described later. Incidentally, depending on, for example, the film-formation temperature of the second insulating film 12 and conditions of the treatment of decreasing the resistance, when viewed in a direction of a line normal to the substrate 1, the conductor region 70c may have a large size so as to surround the opening of the first insulating film 11 and may overlap edge portions of the first insulating film 11.

In this way, in this embodiment, the oxide film also used for forming the oxide semiconductor layer 7 is used to form the lower-layer electrode of the storage capacitor 201. Thus, without making the process complicated, the storage capacitor 201 can be formed within a pixel region Pix. In addition, since the storage capacitor 201 is formed of a transparent material, the storage capacitor 201 having a desired area (area when viewed in a direction of a line normal to the substrate 1) can be provided without decreasing the aperture ratio, to thereby ensure a sufficient storage capacitance value.

In this embodiment, the oxide semiconductor layer 7 contains an In—Sn—Zn—O-based semiconductor, and the metal oxide layer 8 includes an In—Sn—Zn—O conductor region obtained by decreasing the resistance of the In—Sn—Zn—O-based semiconductor. Thus, as described above with reference to Table 1, the electric resistance can be further decreased than in the In—Ga—Zn—O conductor region. The electric resistance may be, for example, 200Ω/□ or less. In this embodiment, regardless of the formation temperature of the second insulating film 12, the metal oxide layer 8 can be formed so as to have a desired electric resistance.

In this embodiment, the oxide semiconductor layer 7 and the metal oxide layer 8 are formed from the same oxide film and contain the same metal oxide. The metal oxide contained in these layers may be an amorphous metal oxide or may be a crystalline metal oxide having a crystalline portion. Examples of the crystalline metal oxide include polycrystalline metal oxides, microcrystalline metal oxides, and crystalline metal oxides in which the c axis is oriented substantially perpendicular to the layer surface.

The oxide semiconductor layer 7 and the metal oxide layer 8 may have a multilayer structure including two or more layers. In this case, the oxide semiconductor layer 7 and the metal oxide layer 8 may include an amorphous metal oxide layer and a crystalline metal oxide layer, or may include a plurality of crystalline metal oxide layers having different crystal structures. When one or both of the oxide semiconductor layer 7 and the metal oxide layer 8 have a bilayer structure including an upper layer and a lower layer, the energy gap of the metal oxide contained in the upper layer is preferably larger than the energy gap of the metal oxide contained in the lower layer. However, when the difference between the energy gaps of these layers is relatively small, the energy gap of the metal oxide of the lower layer may be larger than the energy gap of the metal oxide of the upper layer.

The materials, structures, and film-formation methods of the amorphous metal oxide and the above-described crystalline metal oxides, the configurations of metal oxide layers having multilayer structures, and the like are described in, for example, Japanese Unexamined Patent Application Publication No. 2014-007399. The content of Japanese Unexamined Patent Application Publication No. 2014-007399 is herein incorporated by reference in its entirety.

In this embodiment, the oxide semiconductor layer 7 and the metal oxide layer 8 contain a metal oxide containing In, Sn, and Zn. This metal oxide may be an In—Sn—Zn—O-based metal oxide (for example, $In_2O_3$—$SnO_2$—ZnO) or may be an In—Al—Sn—Zn—O-based metal oxide. The In—Sn—Zn—O-based metal oxide is a three-element oxide containing In (indium), Sn (tin), and Zn (zinc). The composition of the In—Sn—Zn—O-based metal oxide is not particularly limited; however, the number of indium atoms represented by [In], the number of tin atoms represented by [Sn], and the number of zinc atoms represented by [Zn] preferably satisfy the following formulas, for example.

$$0.2 < [In]/([In]+[Sn]+[Zn]) < 0.4$$

$$0.1 < [Sn]/([In]+[Sn]+[Zn]) < 0.4$$

$$0.2 < [Zn]/([In]+[Sn]+[Zn]) < 0.7$$

Incidentally, the oxide semiconductor layer 7 and the metal oxide layer 8 may include, in addition to the oxide layer containing In, Sn, and Zn, another oxide layer formed of, for example, an In—Ga—Zn—O-based oxide, an In—Al—Zn—O-based oxide, a Zn—O-based oxide, an In—Zn—O-based oxide, a Zn—Ti—O-based oxide, a Cd—Ge—O-based oxide, a Cd—Pb—O-based oxide, CdO (cadmium oxide), a Mg—Zn—O-based oxide, an In—Ga—Sn—O-based oxide, a Zr—In—Zn—O-based oxide, or a Hf—In—Zn—O-based oxide.

The semiconductor device 1001 is, for example, a TFT substrate used for a liquid crystal display apparatus that performs VA (Vertical Alignment) mode displaying. The liquid crystal display apparatus includes a plurality of pixels arranged in a matrix having a row direction and a column direction.

Hereinafter, with reference to FIG. 1(*b*), the configuration of the semiconductor device (TFT substrate) 1001 will be described.

The TFT substrate 1001 includes a plurality of regions (hereafter, "pixel regions") Pix, which correspond to a plurality of pixels of the display apparatus. FIG. 1(*b*) illustrates, of the plurality of pixel regions Pix, two pixel regions Pix1 and Pix2, which are adjacent to each other in the column direction. Incidentally, in the TFT substrate 1001, a region including a plurality of pixels Pix is referred to as a "display region"; and the region other than the display region is referred to as a "non-display region" or a "picture frame region". In the non-display region, terminal portions, driving circuits, and the like can be provided.

The TFT substrate 1001 includes, on the substrate 1, a plurality of source lines (also referred to as source bus lines) S, which extend in the column direction so as to be substantially parallel to one another, and a plurality of gate lines (also referred to as gate bus lines) G, which extend in the row direction so as to be substantially parallel to one another. The row direction and the column direction may be orthogonal to each other. The row direction and the column direction may be respectively the horizontal direction and the vertical direction on the display surface of the liquid crystal display apparatus. When viewed in a direction of a line normal to the substrate 1, the regions surrounded by the source lines S and the gate lines G each serve as a "pixel region Pix". In each pixel region Pix, the TFT 101, the metal oxide layer 8, and the pixel electrode 15 are formed.

FIG. 1(*b*) illustrates, out of the plurality of source lines S, two adjacent source lines S(n) and S(n+1), and three adjacent gate lines G(m−1), G(m), and G(m+1) (n and m represent natural numbers). A region surrounded by the source lines S(n) and S(n+1) and the gate lines G(m−1) and G(m) is referred to as a "first pixel region Pix1", and a region surrounded by the source lines S(n) and S(n+1) and the gate lines G(m) and G(m+1) is referred to as a "second pixel region Pix2".

In the first pixel region Pix1, the gate electrode 3 of the TFT 101 is electrically connected to the gate line G(m), and the source electrode 9*s* is electrically connected to the source line S(n). Similarly, in the second pixel region Pix2, the gate electrode 3 of the TFT 101 is electrically connected to the gate line G(m+1), and the source electrode 9*s* is electrically connected to the source line S(n).

In the two pixel regions Pix1 and Pix2, which are adjacent to each other in the column direction, the conductor regions 70*c* of the metal oxide layers 8 may be electrically connected to each other. The conductor regions 70*c* of all the pixel regions Pix arranged in the column direction (not shown) may be electrically connected together. In this case, to the conductor regions 70*c* (functioning as storage capacitor electrodes) of a plurality of pixel regions Pix, a common storage capacitor voltage (Cs voltage) can be applied.

In this embodiment, in the adjacent first and second pixel regions Pix1 and Pix2, the metal oxide layers 8 are collectively formed, and the conductor regions 70*c* of the metal oxide layers 8 join together. Stated another way, when viewed in a direction of a line normal to the substrate 1, the metal oxide layers 8 of the pixel regions Pix1 and Pix2 constitute a metal oxide wiring that extends from the first pixel region Pix1 across above a gate line G (here, the gate line G(m)) to the second pixel region Pix2.

The metal oxide layers 8 of three or more pixel regions Pix arranged in each column, preferably all the pixel regions Pix arranged in each column, may be collectively formed. For example, the metal oxide layers 8 of a plurality of pixel regions Pix arranged in the column direction may collectively constitute a metal oxide wiring that extends in the column direction and across above a plurality of gate lines G.

In this embodiment, in each pixel region Pix, a TFT 101 is disposed in an area near the intersection of the source line S and the gate line G. A contact section 17, which electrically connects the pixel electrode 15 and the drain electrode 9*d* of the TFT 101, is disposed adjacent to the TFT 101 in the column direction. In the example illustrated, when viewed in a direction of a line normal to the substrate 1, the TFT 101 in the first pixel electrode Pix1 is positioned near the intersection of the source line S(n) and the gate line G(m); and the contact section 17 is disposed in a region surrounded by the source line S(n), the gate line G(m), and the metal oxide layer 8. This configuration enables, without causing a decrease in the aperture ratio, a connection between the metal oxide layers 8 of two pixel regions Pix adjacent to each other in the column direction.

When viewed in a direction of a line normal to the substrate 1, the gate line G may include a first portion and a second portion having a smaller width than the first portion. The channel region of the oxide semiconductor layer 7 of the TFT 101 is disposed so as to overlap the first portion of the gate line G. As illustrated in the drawing, the whole oxide semiconductor layer 7 may overlap the first portion of the gate line G. In this case, the gate line G also functions as a light-shielding film for the oxide semiconductor layer 7, to thereby suppress fluctuations in the TFT characteristics due to entry of light into the oxide semiconductor layer 7. In addition, the width of a portion of the gate line G, the portion not overlapping the TFT 101, is decreased, to thereby suppress a decrease in the aperture ratio due to the gate line G. The metal oxide layers 8 of the two pixel regions Pix1 and Pix2 adjacent to each other in the column direction may be collectively formed so as to extend across above the second portion of the gate line G(m) positioned between these pixel regions Pix.

The gate electrode 3 is electrically connected to the gate line G, and may be formed from a conductive film from which the gate line G is also formed. The gate electrode 3 and the gate line G may be collectively formed. For example, the gate electrode 3 may be a portion of the gate line G. In other words, a portion of the gate line G, the portion overlapping the channel region of the oxide semiconductor layer 7 of the TFT 101, may function as the gate electrode 3. When viewed in a direction of a line normal to the substrate 1, the gate line G may include a portion extending in a predetermined direction, and an extension portion extending from the portion in a direction different from the predetermined direction; and the extension portion may function as the gate electrode 3.

The source electrode 9*s* and the drain electrode 9*d* may be formed from a conductive film from which the source line S is also formed. The source electrode 9*s* is electrically connected to the source line S; and the source electrode 9*s* and the source line S may be collectively formed. For example, the source electrode 9*s* may be a portion of the source line G. In other words, a portion of the source line G, the portion being in contact with the oxide semiconductor layer 7 of the TFT 101, may function as the source electrode 9s. When viewed in a direction of a line normal to the substrate 1, the source line S may include a portion extending in a predetermined direction and an extension portion extending from the portion in a direction different from the predetermined direction; and the extension portion may function as the source electrode 9s.

In this embodiment, when viewed in a direction of a line normal to the substrate 1, the source line S extends across the oxide semiconductor layer 7. A portion of the source line S, the portion being in contact with the upper surface of the oxide semiconductor layer 7, functions as the source electrode 9s. On the other hand, the drain electrode 9d is in contact with the oxide semiconductor layer 7 and extends from the oxide semiconductor layer 7 to the contact section 17. In this example, the drain electrode 9d extends substantially in parallel to the source line S, and is in contact with the pixel electrode 15 in the contact section 17.

<Method for Manufacturing Semiconductor Device 1001>

Figure 2:
FIG. 2(a) to FIG. 2(f) are sectional views illustrating steps of a method for manufacturing the semiconductor device 1001 according to the first embodiment.
Figure 2:
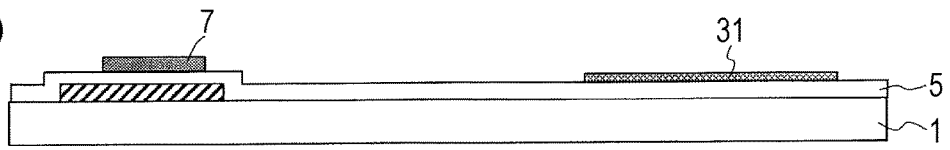
Figure 2:
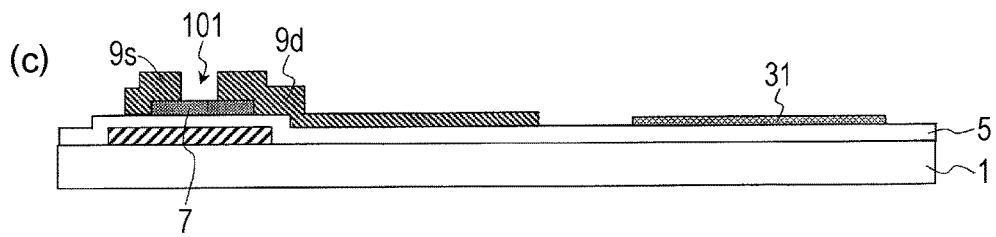
Figure 2:
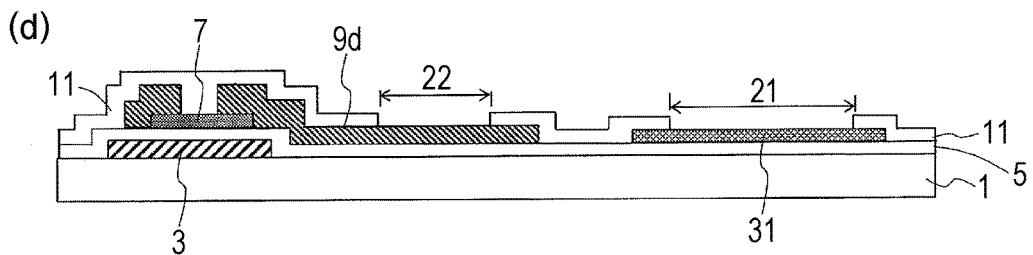
Figure 2:
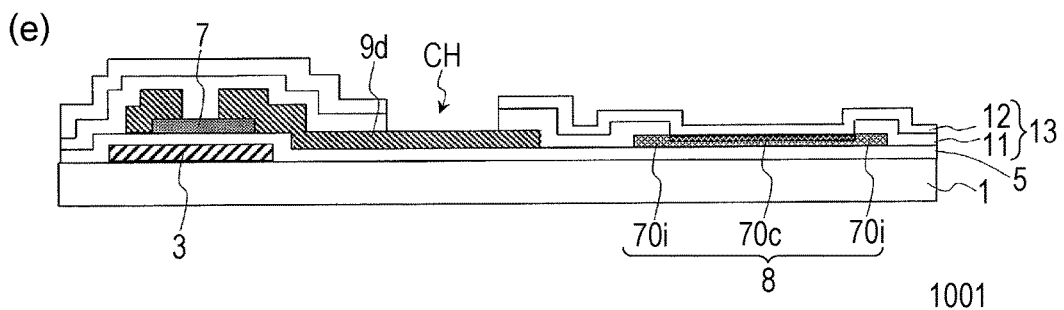
Figure 2:
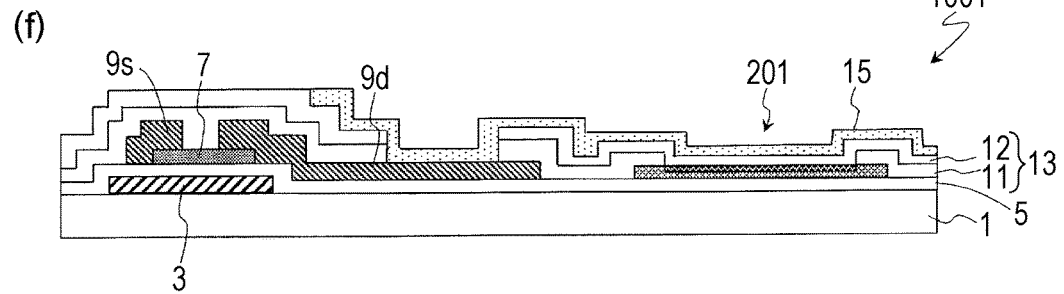

Hereinafter, with reference to FIG. 2, an example of a method for manufacturing the semiconductor device (TFT substrate) 1001 according to this embodiment will be described. FIG. 2(a) to FIG. 2(f) are sectional views illustrating steps of the method for manufacturing the TFT 101 and the storage capacitor 201 in the TFT substrate 1001. These sectional views correspond to sections taken along line A-A' in FIG. 1(b).

As illustrated in FIG. 2(a), a metal film for the gate is first formed on the substrate 1, and subsequently patterned by a known photolithographic step. This results in formation of a gate wiring layer including the gate electrode 3 and a gate line (not shown). Subsequently, the gate insulating layer 5 is formed so as to cover the gate wiring layer.

The substrate 1 may be a substrate that is transparent and has insulating properties. Here, a glass substrate is used.

The material of the electrode film for the gate is not particularly limited, and a film containing a metal such as aluminum (Al), tungsten (W), molybdenum (Mo), tantalum (Ta), chromium (Cr), titanium (Ti), or copper (Cu) or an alloy of the foregoing may be appropriately used. A multilayer film including a plurality of such films may also be used. Here, as the electrode film for the gate, a multilayer film (W/TaN) including a W film (thickness: 300 nm) as an upper layer and a TaN film (thickness: 30 nm) as a lower layer is used.

As the gate insulating layer 5, for example, a silicon oxide ($SiO_2$) layer or a silicon nitride (SiNO layer may be used. Here, as the gate insulating layer 5, a multilayer film is used that includes a silicon oxide ($SiO_2$) layer (thickness: 10 to 100 nm) as an upper layer, and a silicon nitride (SiNO layer (thickness: 50 to 500 nm) as a lower layer.

Subsequently, as illustrated in FIG. 2(b), on the gate insulating layer 5, an oxide semiconductor film is formed by a sputtering method, for example, and patterned to provide the oxide semiconductor layer 7 and an oxide semiconductor layer 31. The oxide semiconductor layer 7 is disposed so as to overlap the gate electrode 3 (gate line G) with the gate insulating layer 5 therebetween. Here, as the oxide semiconductor film, an In—Sn—Zn—C-based semiconductor film (thickness: 5 to 200 nm) is used, for example.

Subsequently, an electrode film for the source is formed so as to cover the oxide semiconductor layers 7 and 31 by a sputtering method, for example. Subsequently, as illustrated in FIG. 2(c), the electrode film for the source is patterned by a known photolithographic step to thereby form a source wiring layer including the source electrode 9s, the drain electrode 9d, and a source line (not shown). The source electrode 9s and the drain electrode 9d are disposed so as to be in contact with the oxide semiconductor layer 7. Thus, the TFT 101 is formed.

The material of the electrode film for the source is not particularly limited, and a film can be appropriately used that contains a metal such as aluminum (Al), tungsten (W), molybdenum (Mo), tantalum (Ta), copper (Cu), chromium (Cr), or titanium (Ti), an alloy of the foregoing, or a metal nitride of the foregoing. Here, as the electrode film for the source, a multilayer film (Ti/Al/Ti) is used that includes, in the following order from the substrate 1-side, a Ti film (thickness: 30 nm), an Al film (200 nm), and a Ti film (100 nm).

Subsequently, the oxide semiconductor layers 7 and 31 may be subjected to an oxidation treatment.

Subsequently, as illustrated in FIG. 2(d), the first insulating film 11 is formed so as to cover the source wiring layer and the oxide semiconductor layers 7 and 31. As the first insulating film 11, a $SiO_2$ layer can be used, for example. The thickness of the first insulating film 11 is not particularly limited; however, the first insulating film 11 having a thickness of, for example, 200 nm or more, can function, with more certainty, as a mask in the step of decreasing the resistance. On the other hand, in order to achieve space-savings in the TFT substrate, the thickness is preferably 500 nm or less.

Subsequently, in the first insulating film 11, an opening 21 through which a portion of the oxide semiconductor layer 31 is exposed, and an opening 22 through which a portion of the drain electrode 9d is exposed are formed.

Subsequently, as illustrated in FIG. 2(e), on the first insulating film 11 and within the openings 21 and 22, the second insulating film 12 is formed. As the second insulating film 12, a reducing insulating film (for example, a SiNx film) having a property of reducing the oxide semiconductor contained in the oxide semiconductor layer 31 is used. This causes a decrease in the resistance of a portion of the oxide semiconductor layer 31 to provide the metal oxide layer 8. Here, a decrease in the resistance is caused in a near-surface region of a portion of the oxide semiconductor layer 31, the portion being, within the opening 21, in contact with the second insulating film 12, to provide the conductor region 70c. Of the oxide semiconductor layer 31, a portion being covered by the first insulating film 11 and not being in contact with the second insulating film 12 is not subjected to a decrease in the resistance and remains as the semiconductor region 70i. The electric resistance of the conductor region 70c is lower than the electric resistance of the semiconductor region 70i and may be, for example, 200Ω/☐ or less. After the second insulating film 12 is formed, an annealing treatment may be performed.

In this example, as the second insulating film 12, a reducing insulating film is used, such as a silicon nitride (SiNx) film, a silicon oxide nitride (SiOxNy; x>y) film, or a silicon nitride oxide (SiNxOy; x>y) film. The second insulating film 12 is also used as a capacitive insulating film forming a storage capacitor; for this reason, the material and the thickness of the second insulating film 12 are preferably appropriately selected so as to obtain a predetermined capacitance $C_{CS}$. From the viewpoint of a dielectric constant and insulating properties, SiNx can be preferably used. The second insulating film 12 has a thickness of, for example, 70 nm or more and 180 nm or less. When the thickness is 70 nm or more, insulating properties can be ensured with more certainty. On the other hand, when the thickness is 180 nm or less, a predetermined capacitance $C_{CS}$ can be obtained with more certainty.

The method of forming the SiNx film is not particularly limited. For example, the SiNx film is formed under conditions in which the substrate temperature is about 100° C. or more and about 250° C. or less (for example, 220° C.), and the flow rate (unit: sscm) of a $SiH_4$—$NH_3$ gas mixture is controlled such that the flow rate ratio (flow rate of $SiH_4$/flow rate of $NH_3$) is 4 or more and 20 or less.

Subsequently, a known photolithographic step is performed to remove, of the second insulating film 12, a portion positioned within the opening 22. This results in formation of a contact hole CH, which extends through the first and second insulating films 11 and 12 and through which the drain electrode 9d is exposed.

Subsequently, as illustrated in FIG. 2(f), on the second insulating film 12 and within the contact hole CH, a transparent conductive film is formed and patterned in a known photolithographic step to thereby form the pixel electrode 15.

Examples of the transparent conductive film include ITO (indium-tin oxide) films, IZO films, and ZnO films (zinc oxide films). Here, as the transparent conductive film, an ITO film (thickness: 100 nm) is used.

The pixel electrode 15 is disposed within the opening 21 so as to overlap the conductor region 70c of the metal oxide layer 8 with the second insulating film 12 therebetween. Thus, the storage capacitor 201 is formed in which the conductor region 70c serves as a lower-layer electrode, the second insulating film 12 serves as the dielectric layer, and the pixel electrode 15 serves as an upper-layer electrode. In this way, the TFT substrate 1001, which includes the TFT 101 and the storage capacitor 201 within the pixel region Pix, is obtained.

In the above-described method, the second insulating film 12 is used to cause a decrease in the resistance of the oxide semiconductor layer 31. Alternatively, another method such as a plasma treatment may be performed to cause a decrease in the resistance. For example, in the step illustrated in FIG. 2(d), such a treatment of causing a decrease in the resistance may be performed on, through the first insulating film 11 serving as a mask, a portion of the oxide semiconductor layer 31, the portion being exposed through the opening 21, to form the conductor region 70c.

Specifically, after the openings 21 and 22 are formed in the first insulating film 11, the substrate 1 is exposed to reducing plasma or plasma containing a doping element (treatment of causing a decrease in the resistance). Here, the substrate 1 is exposed to argon plasma, which is reducing plasma. This causes a decrease in the resistance of the near-surface region of a portion of the oxide semiconductor layer 31, the portion being exposed through the opening 21, so that the portion is turned into the conductor region 70c. Of the oxide semiconductor layer 31, a region that is masked with the first insulating film 11 and is not subjected to a decrease in the resistance remains as the semiconductor region 70i. The thickness of the conductor region 70c can vary depending on the conditions of the treatment of causing a decrease in the resistance. Subsequently, the second insulating film 12 is formed. In this case, the second insulating film 12 may not be necessarily a reducing insulating film. Incidentally, the method and conditions of the treatment of causing a decrease in the resistance are not limited to those described above. PTL 2 describes a specific method of performing a treatment of causing a decrease in the resistance (plasma treatment), and the mechanism by which the method causes a decrease in the electric resistance of the oxide semiconductor. The content of PTL 2 is herein incorporated by reference in its entirety.

Second Embodiment

A semiconductor device according to a second embodiment of the present invention will be described with reference to a drawing. In the semiconductor device of this embodiment, the interlayer insulating layer 13 includes an organic insulating film such as a planarization resin film, which is different from the semiconductor device 1001 illustrated in FIG. 1.

Figure 3:
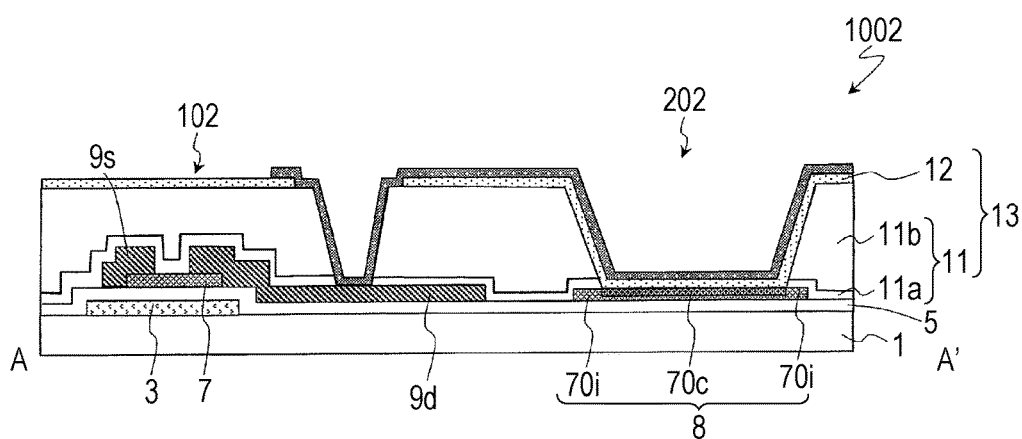
FIG. 3 is a sectional view illustrating, as an example, a semiconductor device 1002 according to a second embodiment.

FIG. 3 is a sectional view illustrating, as an example, a semiconductor device 1002 according to this embodiment. The plan view of the semiconductor device 1002 is the same as in FIG. 1(b) and hence omitted.

The semiconductor device 1002 includes a TFT 102 and a storage capacitor 202. In the semiconductor device 1002, the first insulating film 11 includes an inorganic insulating film (passivation film) 11a, which covers the TFT 102 and a portion of the metal oxide layer 8; and an organic insulating film 11b, which is formed on the inorganic insulating film 11a. The organic insulating film 11b may be a planarization film that can reduce surface irregularities. The inorganic insulating film 11a is, for example, a silicon nitride film (SiNx), a silicon oxide film (for example, $SiO_2$), or a multilayer film of the foregoing. The organic insulating film 11b may be, for example, a positive photosensitive resin film. The other structure is the same as in the semiconductor device 1001 and hence the description thereof is omitted.

The semiconductor device 1002 can be manufactured by the same method as in the semiconductor device 1001 described above with reference to FIG. 2 except that the first insulating film 11 is formed in the following manner, for example.

The oxide semiconductor layers 7 and 31 and the source wiring layer are first formed in the same manner as in FIG. 2(a) to FIG. 2(c).

Subsequently, the inorganic insulating film 11a is formed so as to cover the whole substrate by a CVD method, for example. The inorganic insulating film 11a may be, for example, a film having a thickness of about 50 nm to about 500 nm and formed of silicon nitride ($SiN_x$), silicon oxide ($SiO_2$), silicon oxide nitride ($SiO_xN_y$; x>y), or silicon nitride oxide ($SiN_xO_y$; x>y), or a multilayer film of the foregoing. Here, as the inorganic insulating film 11a, a multilayer film is used that includes a $SiO_2$ film (thickness: 300 nm) as a lower layer and a SiNX film (thickness: 100 nm) as an upper layer.

Subsequently, on the inorganic insulating film 11a, the organic insulating film 11b is formed by coating, for example. Subsequently, the organic insulating layer film 11b is patterned to form an opening portion above the drain electrode 9d.

The organic insulating film 11b is, for example, a transparent resin layer having a thickness of about 1000 nm to about 5000 nm. Compared with ordinary inorganic insulating layers, such a transparent resin layer can be easily formed as a thick film having a low dielectric constant; this provides an advantage of enabling a decrease in the parasitic capacitance between an electrode (such as a pixel electrode) formed over the transparent resin layer and an electrode or wiring (such as a gate bus line or a source bus line) formed under the transparent resin layer. The organic insulating film 11b may be a planarization film disposed in order to reduce the surface irregularities (to achieve planarization) of the substrate 1. Here, as the organic insulating film 11b, a positive photosensitive resin film having a thickness of, for example, 2000 nm is used.

Examples of the material of the organic insulating film 11b include photosensitive resins such as acrylic photosensitive resins, silicone-based photosensitive resins, and polyimide-based photosensitive resins. When a photosensitive resin material is used, formation of a resist pattern is not necessary and the photosensitive resin film can be exposed and developed, in other words, patterned. After the patterning, annealing is performed to fire the patterned film. The annealing provides a smoothly curved surface (around the opening) of the organic insulating film 11b. The annealing is preferably performed at 190° C. to 230° C., more preferably at 200° C. to 220° C., for 30 minutes to 2 hours, more preferably for about 1 hour.

Subsequently, the inorganic insulating film 11a is etched through the patterned organic insulating film 11b serving as a mask. This results in formation of an opening portion through which a portion of the drain electrode 9d is exposed in the inorganic insulating film 11a and the organic insulating film 11b. The step subsequently performed is the same as the step described above with reference to FIG. 2(e), and hence the description thereof is omitted.

Third Embodiment

A semiconductor device according to a third embodiment of the present invention will be described with reference to a drawing. In the semiconductor device according to this embodiment, the oxide semiconductor layer 7 has a multilayer structure, which is different from the semiconductor devices 1001 and 1002 of the first and second embodiments.

Figure 4:
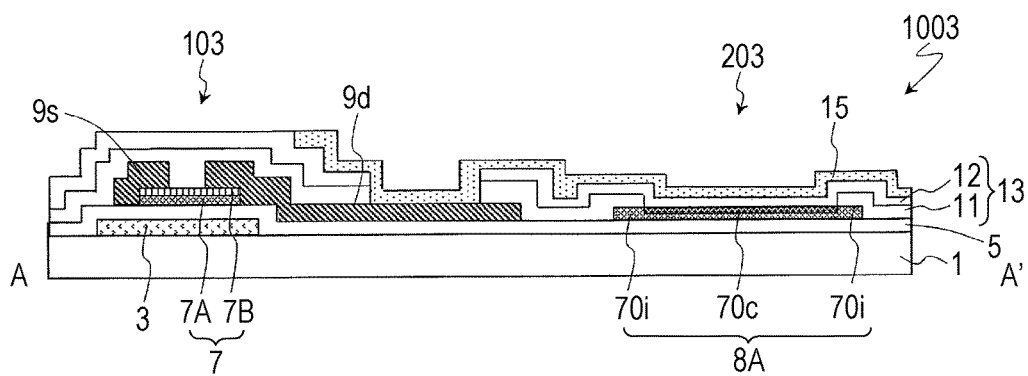
FIG. 4 is a sectional view illustrating, as an example, a semiconductor device 1003 according to a third embodiment.

FIG. 4 is a sectional view illustrating, as an example, a semiconductor device 1003 of this embodiment. The plan view of the semiconductor device 1003 is the same as in FIG. 1(b), and hence is omitted.

The semiconductor device 1003 includes a TFT 103 and a storage capacitor 203. The storage capacitor 203 has the same structure as in the storage capacitor 201 illustrated in FIG. 1. In the TFT 103, the oxide semiconductor layer 7 serving as an active layer has a multilayer structure including a first oxide semiconductor layer 7A and a second oxide semiconductor layer 7B. The first oxide semiconductor layer 7A is disposed on the gate insulating layer 5-side of the second oxide semiconductor layer 7B so as to be in contact with the second oxide semiconductor layer 7B. The second oxide semiconductor layer 7B is disposed so as to be in contact with the upper surface of the first oxide semiconductor layer 7A. The second oxide semiconductor layer 7B may be the uppermost layer of the oxide semiconductor layer 7, and the first oxide semiconductor layer 7A may be the lowermost layer of the oxide semiconductor layer 7. The metal oxide layer 8A, which is a lower electrode of the storage capacitor 203, is formed from an oxide film from which the first oxide semiconductor layer 7A is also formed, the first oxide semiconductor layer 7A being a lower layer of the oxide semiconductor layer 7. The other structure is the same as in the semiconductor device 1001, and hence the description thereof is omitted.

The first oxide semiconductor layer 7A contains In, Sn, and Zn. The second oxide semiconductor layer 7B contains In and Ga and does not contain Sn. The first oxide semiconductor layer 7A may be, for example, an In—Sn—Zn—O-based semiconductor layer or formed of an In—Al—Sn—Zn—O-based semiconductor. The second oxide semiconductor layer 7B may be, for example, an In—Ga—Zn—O-based semiconductor layer or an In—Ga—O-based semiconductor layer. The first oxide semiconductor layer 7A, which contains In, Sn, and Zn, can have a high mobility. The second oxide semiconductor layer 7B, which does not contain readily reducible Sn, enables suppression of a decrease in the oxygen concentration caused by reduction of metal contained in the oxide semiconductor layer 7.

The channel region of the TFT 103 may be in contact with an oxygen-containing insulating film such as an oxide film, such as a $SiO_2$ film. In this example, the first insulating film 11 is a $SiO_2$ film. Incidentally, the first insulating film 11 may be a multilayer film including a $SiO_2$ film as a lower layer.

In the TFT 103, the active layer has the above-described multilayer structure to thereby reduce variations in the characteristics of the TFT 103. The reason for this will be described later in detail. On the other hand, in the storage capacitor 203, only the first oxide semiconductor film containing In, Sn, and Zn is subjected to a decrease in the resistance to form the metal oxide layer 8A, which is a storage capacitor electrode. Thus, as in the above-described embodiment, regardless of the film-formation temperature of the second insulating film 12, a storage capacitor electrode having a low electric resistance can be formed with stability.

Figure 5:
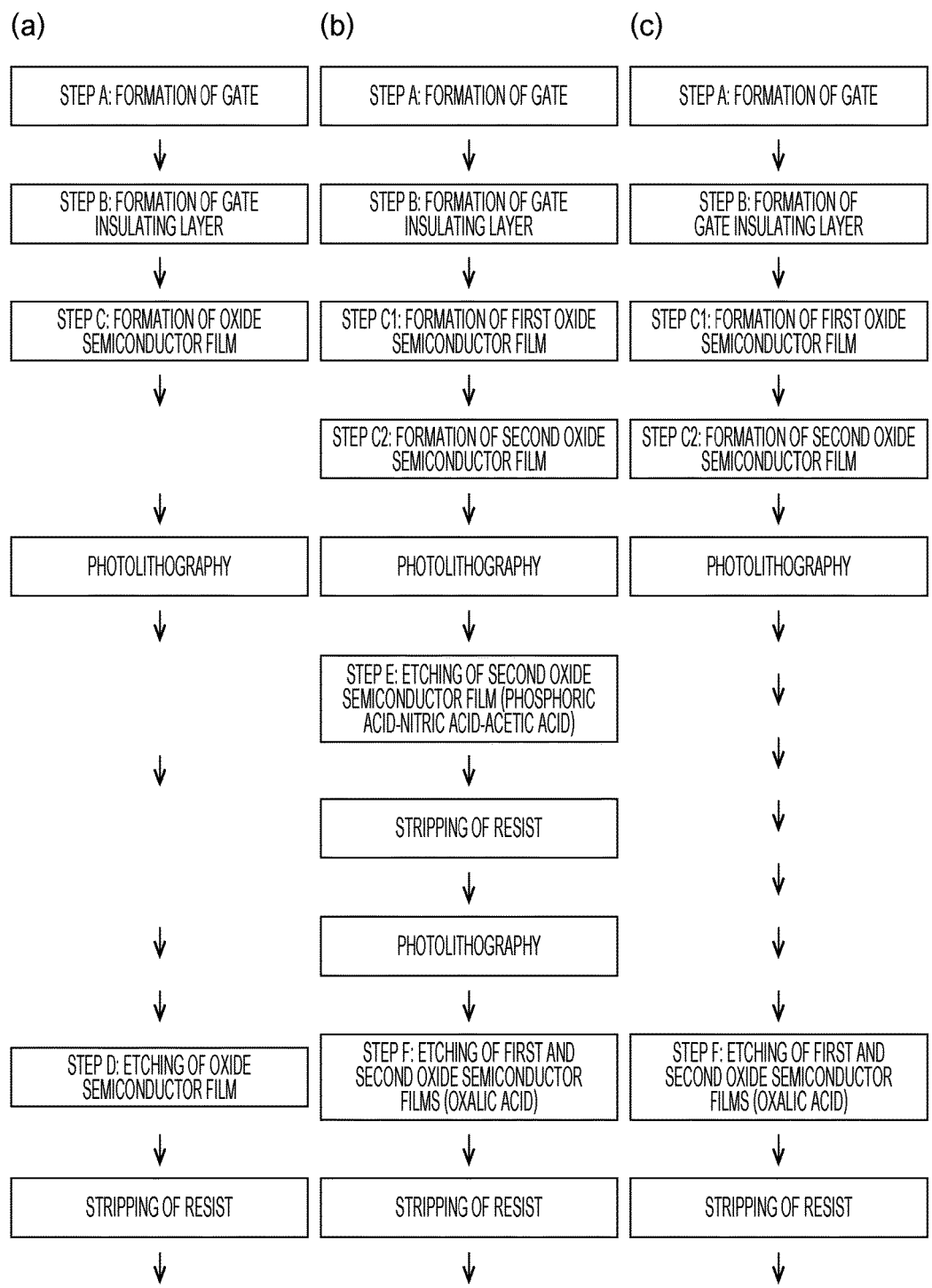
FIG. 5(a) to FIG. 5(c) respectively illustrate portions of methods for manufacturing the semiconductor device 1001 according to the first embodiment, the semiconductor device 1003 according to the third embodiment, and a semiconductor device 1004 according to a fourth embodiment.

Hereinafter, an example of a method for manufacturing the semiconductor device 1003 will be described. FIG. 5(a) is a flowchart of a portion of the method for manufacturing the semiconductor device 1001 in FIG. 1; and FIG. 5(b) is a flowchart of a portion of the method for manufacturing the semiconductor device 1003 of this embodiment. As is understood from FIG. 5, the semiconductor device 1003 can be manufactured by the same method as the method for manufacturing the semiconductor device 1001 except for the following differences: as the oxide semiconductor film, a multilayer film including a first oxide semiconductor film and a second oxide semiconductor film is formed (Steps C1 and C2); and only the second oxide semiconductor film out of the multilayer film is patterned (Step E), to individually form an oxide semiconductor layer 7 and an oxide semiconductor layer 31 serving as a storage capacitor electrode.

Hereinafter, only the differences from the method for manufacturing the semiconductor device 1001 will be described.

In the Steps C1 and C2, a first oxide semiconductor film containing In, Ga, and Sn, and a second oxide semiconductor film containing In and Ga are deposited in this order on the gate insulating layer 5, to form a multilayer film. Here, for example, a sputtering method is used to form, as the first oxide semiconductor film, an In—Sn—Zn—O-based semiconductor film having a thickness of 35 nm, and, as the second oxide semiconductor film, an In—Ga—Zn—O-based semiconductor film having a thickness of 35 nm.

Figure 9:
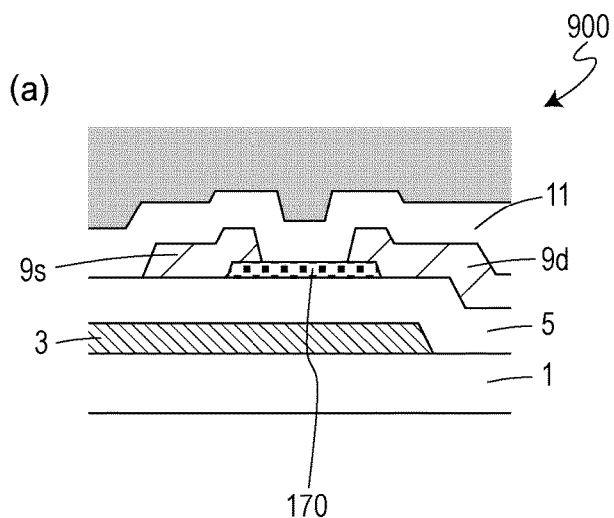
FIG. 9(a) is a sectional view illustrating the configuration of a TFT 900 including a semiconductor monolayer, and FIG. 9(b) and FIG. 9(c) respectively illustrate depth profiles of elements of an In—Ga—Zn—O-based semiconductor layer and an In—Sn—Zn—O-based semiconductor layer.
Figure 9:
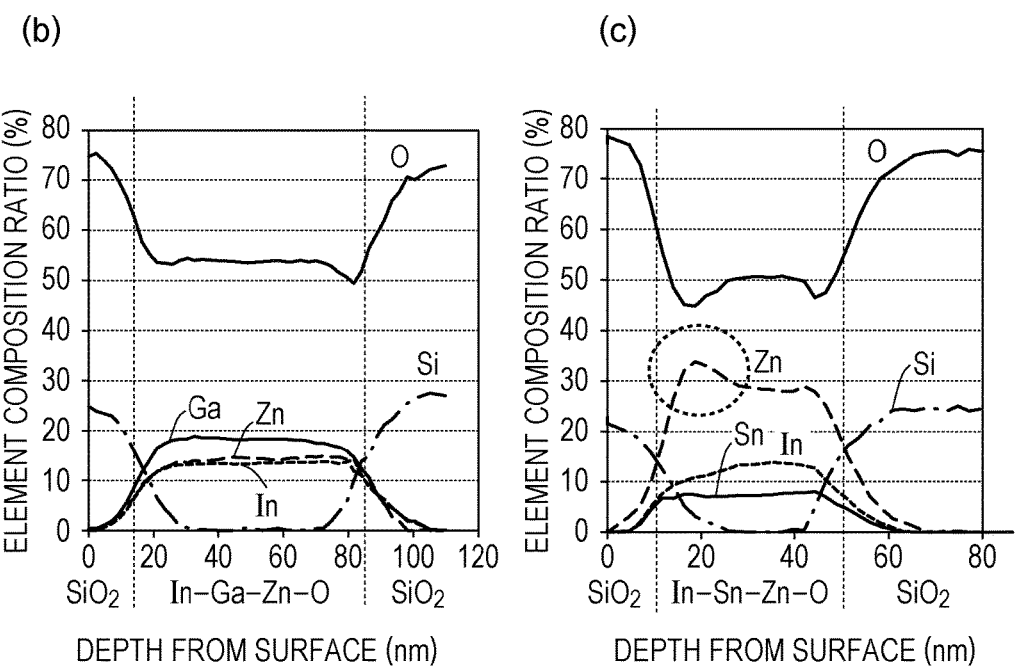

The first oxide semiconductor film that is to serve as the first oxide semiconductor layer 7A has a thickness of, for example, 2 nm or more and 100 nm or less. When the thickness is 2 nm or more, electrons move through mainly the first oxide semiconductor layer 7A, compared with in the second oxide semiconductor layer 7B, so that a TFT having a high mobility can be provided. When the thickness is 100 nm or less, the On/Off control of the TFT using the gate voltage can be performed at a higher speed. The second oxide semiconductor film that is to serve as the second oxide semiconductor layer 7B has a thickness of, for example, 5 nm or more and 100 nm or less. When the thickness is 5 nm or more, more effective suppression is achieved for precipitation of Zn and Sn in the near-upper-surface region of the first oxide semiconductor layer 7A (refer to FIG. 9 to FIG. 11). When the thickness is 100 nm or less, the resistance component generated by the second oxide semiconductor layer 7B can be suppressed, to thereby suppress a decrease in the mobility in the TFT.

Subsequently, the second oxide semiconductor film is etched through the first resist mask to remove a portion of the second oxide semiconductor film, the portion being positioned in a region in which a storage capacitor is to be formed (Step E). A portion of the second oxide semiconductor film, the portion being positioned in a region in which the TFT is to be formed, remains without being removed.

In Step E, as the etchant, phosphoric acid-nitric acid-acetic acid is used. The second oxide semiconductor film (In—Ga—Zn—O-based semiconductor film) dissolves in phosphoric acid-nitric acid-acetic acid, but the first oxide semiconductor film (In—Sn—Zn—O-based semiconductor film) does not dissolve in it. Thus, only the second oxide semiconductor film can be etched while the first oxide semiconductor film is left.

Subsequently, the first and second oxide semiconductor films are etched through the second resist mask (Step F). Thus, for the region in which the TFT is to be formed, the oxide semiconductor layer 7 including the first and second oxide semiconductor layers 7A and 7B is formed from the first and second oxide semiconductor films. For the region in which the storage capacitor is to be formed, the oxide semiconductor layer 31 is formed from the first oxide semiconductor film.

In Step F, as the etchant, oxalic acid is used, for example. The In—Sn—Zn—O-based semiconductor film and the In—Ga—Zn—O-based semiconductor film both dissolve in oxalic acid. Thus, both of the first and second oxide semiconductor films can be etched.

Subsequently, in the same manner as in FIG. 2, the first insulating film is formed, which has an opening portion through which a portion of the oxide semiconductor layer 31 is exposed. Subsequently, the second insulating film is formed to cause a decrease in the resistance of at least a portion of the oxide semiconductor layer 31, to thereby obtain the metal oxide layer 8A. The subsequent steps are performed in the same manner as in FIG. 2.

Figure 6:
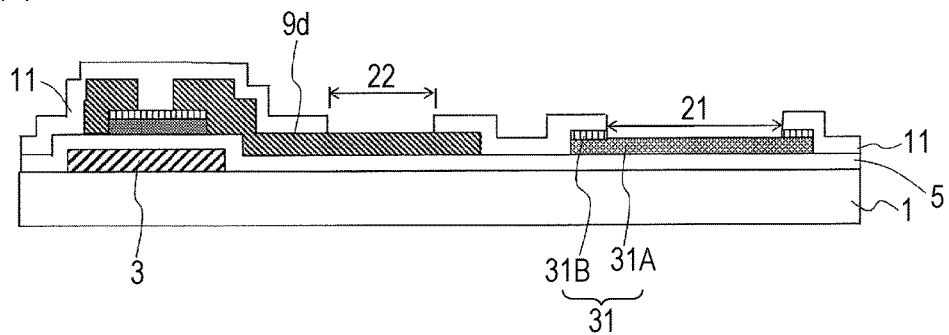
FIG. 6(a) and FIG. 6(b) are sectional views illustrating, as examples, steps of other methods for manufacturing the semiconductor device 1003.
Figure 6:
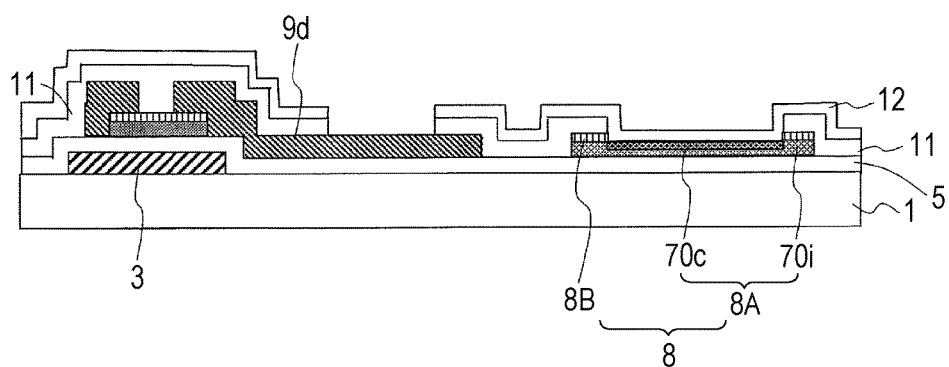

Incidentally, Step E above may not be performed and, in Step F, both of the first and second oxide semiconductor films may be etched. This provides, as illustrated in FIG. 6(a), oxide semiconductor layers 7 and 31 having multilayer structures. The oxide semiconductor layer 31 includes a first oxide semiconductor layer 31A and a second oxide semiconductor layer 31B. Subsequently, a first insulating film 11 having openings 21 and 22 may be formed, and the second oxide semiconductor layer 31B exposed through the opening 21 of the first insulating film 11 may be removed with phosphoric acid-nitric acid-acetic acid. Subsequently, as illustrated in FIG. 6(b), a second insulating film 12 is formed on the first insulating film 11 and within the opening 21. This causes a decrease in the resistance of a portion of the oxide semiconductor layer 31, the portion being in contact with the second insulating film 12, to thereby provide a metal oxide layer 8. The method illustrated in FIG. 6 enables a decrease in the number of masks, compared with the process illustrated in FIG. 5(b). The metal oxide layer 8 formed by this method includes a first metal oxide layer 8A, which includes a conductor region 70c and a semiconductor region 70i, and a second metal oxide layer 8B, which is disposed on a portion of the first metal oxide layer 8A. The second metal oxide layer 8B is positioned on the semiconductor region 70i, and is not formed on the conductor region 70c. A decrease in the resistance may be caused in an opening 21-side end surface of the second metal oxide layer 8B (not shown).

The oxide semiconductors contained in the first oxide semiconductor film and the second oxide semiconductor film in this embodiment may each be an amorphous oxide semiconductor or may be a crystalline oxide semiconductor having a crystalline portion. Examples of the crystalline oxide semiconductor include polycrystalline oxide semiconductors, microcrystalline oxide semiconductors, and crystalline oxide semiconductors in which the c axis is oriented substantially perpendicular to the layer surface.

The first and second oxide semiconductor layers 7A and 7B and the first and second metal oxide layers 8A and 8B may each be an amorphous oxide semiconductor layer or may each be a crystalline oxide semiconductor layer. For example, the first oxide semiconductor layer 7A may be a crystalline In—Sn—Zn—O-based semiconductor layer, and the second oxide semiconductor layer 7B may be an amorphous In—Ga—Zn—O-based semiconductor layer. Preferably, the first and second oxide semiconductor layers 7A and 7B are each a crystalline oxide semiconductor layer. The energy gap of the oxide semiconductor contained in the second oxide semiconductor layer 7B serving as an upper layer is preferably larger than the energy gap of the oxide semiconductor contained in the first oxide semiconductor layer 7A serving as a lower layer. However, when the difference between the energy gaps of these layers is relatively small, the energy gap of the oxide semiconductor of the lower layer may be larger than the energy gap of the oxide semiconductor of the upper layer.

In this embodiment, the first oxide semiconductor film (the first oxide semiconductor layer 7A and the first metal oxide layer 8A) can have the same composition as the oxide semiconductor film described above with reference to FIG. 1 and FIG. 2.

On the other hand, the second oxide semiconductor film (the second oxide semiconductor layer 7B and the second metal oxide layer 8B) may contain an In—Ga—Zn—O-based oxide or may contain an In—Ga—O-based oxide, for example. The In—Ga—Zn—O-based oxide denotes a three-element oxide of In (indium), Ga (gallium), and Zn (zinc) in which the composition ratios of In, Ga, and Zn are not particularly limited and examples of the ratios include In:Ga:Zn=2:2:1, In:Ga:Zn=1:1:1, In:Ga:Zn=1:1:2, In:Ga:Zn=1:3:2, and In:Ga:Zn=1:3:6. As described later, in this embodiment, the ratios of Ga or Zn are preferably higher than the ratio of In in the In—Ga—Zn—O-based oxide. In this case, the blocking capability is enhanced, to suppress more effectively a decrease in the resistance of the lower layer. For this reason, among the above-described composition ratios, for example, preferred are In:Ga:Zn=1:1:2, In:Ga:Zn=1:3:2, and In:Ga:Zn=1:3:6.

The In—Ga—Zn—O-based oxide may be amorphous or may be crystalline. The crystalline In—Ga—Zn—O-based oxide is preferably a crystalline In—Ga—Zn—O-based oxide in which the c axis is oriented substantially perpendicular to the layer surface.

Incidentally, the crystal structure of the crystalline In—Ga—Zn—O-based semiconductor is disclosed in, for example, the above-described publications, such as Japanese Unexamined Patent Application Publication No. 2014-007399, Japanese Unexamined Patent Application Publication No. 2012-134475, and Japanese Unexamined Patent Application Publication No. 2014-209727. The contents of Japanese Unexamined Patent Application Publication No. 2012-134475 and Japanese Unexamined Patent Application Publication No. 2014-209727 are herein incorporated by reference in their entirety. A TFT including such an In—Ga—Zn—O-based semiconductor layer has a high mobility (more than 20 times that of an a-Si TFT) and a low leakage current (less than 1/100 of that of an a-Si TFT), and hence is suitably used as a drive TFT and a pixel TFT.

Figure 7:
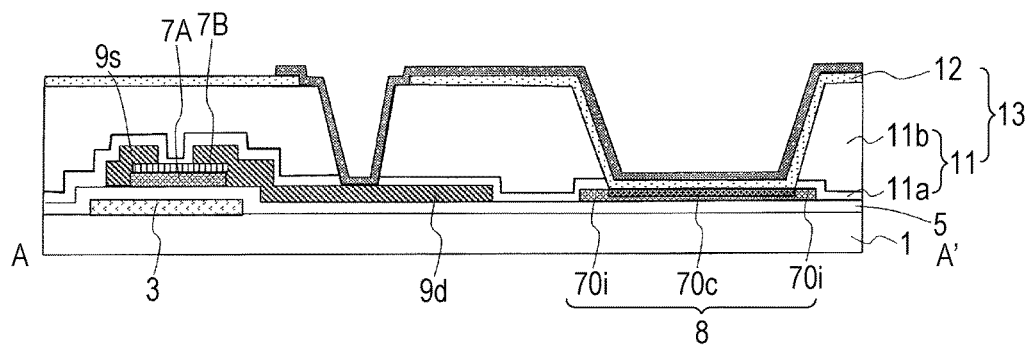
FIG. 7 is a sectional view illustrating, as an example, another semiconductor device according to the third embodiment.

The semiconductor device of this embodiment may include an organic insulating film. FIG. 7 is a sectional view illustrating, as an example, another semiconductor device according to this embodiment. In the illustrated semiconductor device, the interlayer insulating layer 13 includes an organic insulating film such as a planarization resin film, which is different from the semiconductor device 1003 illustrated in FIG. 4. The structure, material, and formation method of the interlayer insulating layer 13 may be the same as in the interlayer insulating layer 13 of the semiconductor device 1002 described above with reference to FIG. 3.

Fourth Embodiment

A semiconductor device according to a fourth embodiment of the present invention will be described with reference to a drawing. In the semiconductor device of this embodiment, both of the oxide semiconductor layer 7 and the metal oxide layer 8 have multilayer structures, which is different from the semiconductor devices 1001 to 1003 of the above-described embodiments.

Figure 8:
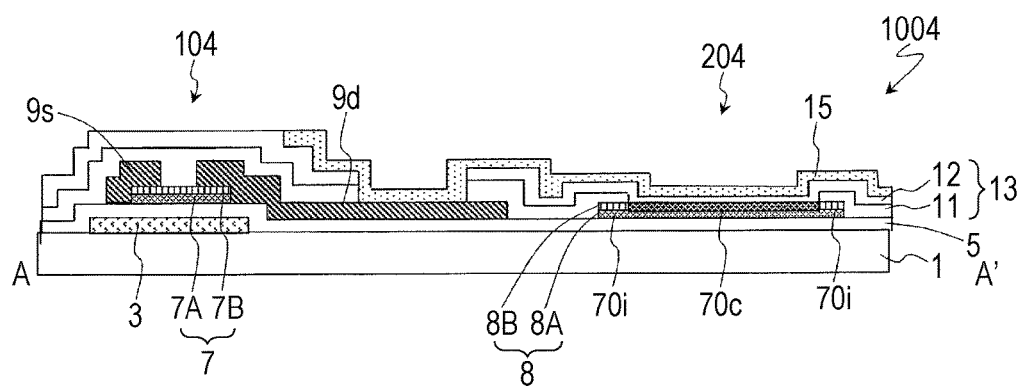
FIG. 8 is a sectional view illustrating, as an example, the semiconductor device 1004 according to the fourth embodiment.

FIG. 8 is a sectional view illustrating, as an example, a semiconductor device 1004 according to this embodiment. The plan view of the semiconductor device 1004 is the same as in FIG. 1(b) and hence is omitted.

The semiconductor device 1004 includes a TFT 104 and a storage capacitor 204. In the TFT 104, the oxide semiconductor layer 7, which serves as an active layer, has a multilayer structure including a first oxide semiconductor layer 7A and a second oxide semiconductor layer 7B. The TFT 104 has a structure the same as the structure of the TFT 103 illustrated in FIG. 4.

In the storage capacitor 204, the metal oxide layer 8, which serves as a lower electrode, has a multilayer structure including a first metal oxide layer 8A and a second metal oxide layer 8B, which is different from the storage capacitor 201 illustrated in FIG. 1. The other structure is the same as in the storage capacitor 201, and hence description thereof is omitted.

The metal oxide layer 8 is formed by causing a decrease in the resistance of an oxide film (multilayer film) from which the oxide semiconductor layer 7 is also formed. Thus, the first metal oxide layer 8A of the metal oxide layer 8 is formed from an oxide film (first oxide semiconductor film) from which the first oxide semiconductor layer 7A is also formed, and contains the same elements as in the first oxide semiconductor layer 7A. The second metal oxide layer 8B of the metal oxide layer 8 is formed from an oxide film (second oxide semiconductor film) from which the second oxide semiconductor layer 7B is also formed, and contains the same elements as in the second oxide semiconductor layer 7B. The first and second oxide semiconductor films may be the same as the films described above with reference to FIG. 5(b).

On a portion of the metal oxide layer 8, the portion being exposed through the opening of the first insulating film 11, a conductor region 70c is formed. In this example, the conductor region 70c includes a region obtained by causing a decrease in the resistance of the first oxide semiconductor film, and a region obtained by causing a decrease in the resistance of the second oxide semiconductor film.

In this embodiment, the active layer of the TFT 104 has the above-described multilayer structure, to thereby achieve stable TFT characteristics. The metal oxide layer 8, which serves as a storage capacitor electrode, includes a conductor region obtained by causing a decrease in the resistance of an oxide semiconductor containing In, Sn, and Zn. Thus, a decrease in the electric resistance can be achieved, compared with, for example, electrodes constituted solely by an In—Ga—Zn—O conductor film. However, in the metal oxide layer 8 of this embodiment, the In—Sn—Zn—O conductor film of the multilayer structure serves as a current path, so that the electric resistance is higher than that in a monolayer electrode constituted solely by an In—Sn—Zn—O conductor film.

In the semiconductor device of this embodiment, the first insulating film 11 may include an organic insulating film (not shown).

A portion of a method for manufacturing the semiconductor device 1004 is illustrated in FIG. 5(c). As is understood from FIG. 5(c), the semiconductor device 1004 can be manufactured by a method the same as the method for manufacturing the semiconductor device 1003 illustrated in FIG. 5(b) except for the following features. The step (Step E) of patterning only the second oxide semiconductor film is not necessary. In addition, in Step F, as the etchant, for example, oxalic acid is used to pattern the first and second oxide semiconductor films, so that, in a region in which a TFT is to be formed, the oxide semiconductor layer 7 is formed from the first and second oxide semiconductor films, and, in a region in which a storage capacitor is to be formed, the oxide semiconductor layer 31 is formed from the first and second oxide semiconductor films. The other steps are similarly performed, and hence description thereof is omitted.

Other Embodiments

Semiconductor devices according to embodiments of the present invention are not limited to the semiconductor devices described above with reference to FIG. 1 to FIG. 8. For example, such a semiconductor device may include both of a TFT (refer to FIG. 4) having a multilayer semiconductor layer constituted by an In—Sn—Zn—O-based semiconductor layer and an In—Ga—Zn—O-based semiconductor layer, and a TFT (refer to FIG. 1) including an In—Sn—Zn—O-based semiconductor monolayer as an active layer. For example, in the display region including a pixel region Pix, a pixel TFT including an In—Sn—Zn—O-based semiconductor monolayer as an active layer may be disposed; and, in a region (non-display region) other than the display region, a driving circuit may be disposed that includes a circuit TFT including a multilayer semiconductor layer. The pixel TFT has a configuration the same as the configuration of the TFT 101 illustrated in FIG. 1. The circuit TFT may have the same configuration as the TFT 103 illustrated in FIG. 4. The lower layer of the multilayer semiconductor layer of the circuit TFT may be formed from a semiconductor film from which the In—Sn—Zn—O-based semiconductor layer of the pixel TFT is also formed. In such a semiconductor device, as a circuit TFT required to have higher reliability, a TFT including a multilayer semiconductor layer is used, which is advantageous.

The above-described semiconductor devices of the embodiments are applied to, for example, vertical alignment mode (VA mode) liquid crystal display apparatuses. Liquid crystal display apparatuses according to embodiments of the present invention are obviously not limited to these apparatuses; the present invention is also applicable to, for example, liquid crystal display apparatuses of a horizontal electric field mode such as an In-Plane Switching (IPS) mode or a Fringe Field Switching (FFS) mode in which a pixel electrode and a counter electrode are disposed on a TFT substrate. The structures of TFTs of IPS-mode or FFS-mode liquid crystal display apparatuses are well known, and hence descriptions thereof are omitted.

Incidentally, FFS-mode liquid crystal display apparatuses and the like are provided with bilayer transparent electrode layers, and storage capacitors can be formed with these layers. By contrast, in general, VA-mode liquid crystal display apparatuses are provided only with transparent electrode monolayers (pixel electrodes). Thus, when the above-described embodiments are applied to VA-mode liquid crystal display apparatuses, transparent storage capacitors can be formed without additional formation of another transparent electrode layer, which is considerably advantageous.

In the descriptions above, liquid crystal display apparatuses are employed as examples; however, the above-described semiconductor devices of the embodiments are also applicable to other display apparatuses such as organic electroluminescence (EL) display apparatuses, inorganic electroluminescence display apparatuses, and MEMS display apparatuses.

The inventors of the present invention repeatedly performed experiments and thoroughly performed studies on characteristics, manufacturing processes, and the like of TFTs including multilayer semiconductor layers. The results will be described below.

(Regarding Characteristics of TFT including Active Layer having a Multilayer Structure)

The inventors of the present invention have found that use of an In—Sn—Zn—O and In—Ga—Zn—O multilayer semiconductor layer as the active layer of an oxide semiconductor TFT (refer to FIG. 4) provides high reliability, compared with the case of using an In—Sn—Zn—O monolayer. Hereinafter, the results of the studies performed by the inventors of the present invention will be described in detail.

Some oxide semiconductor TFTs including an In—Sn—Zn—O-based semiconductor layer as the active layer (hereafter, "In—Sn—Zn—O-based semiconductor TFTs") do not provide desired TFT characteristics. In order to determine the cause of this, the inventors of the present invention manufactured an In—Sn—Zn—O-based semiconductor TFT and a TFT including an In—Ga—Zn—O-based semiconductor layer (hereafter, "In—Ga—Zn—O-based semiconductor TFT"), and measured the concentration profile (in the thickness direction) of the semiconductor layer of each TFT by Auger electron spectroscopic analysis.

FIG. 9(a) is a sectional view illustrating the configuration of an existing TFT 900 used for the concentration profile analysis. The TFT 900 illustrated in FIG. 9(a) is a bottom-gate TFT having a channel etch structure. The TFT 900 includes a substrate 1; a gate electrode 3, which is formed on the substrate 1; a semiconductor layer 170, which is disposed on the gate electrode 3 with a gate insulating layer ($SiO_2$) 5 therebetween; and source and drain electrodes 9. The source and drain electrodes 9 are each disposed so as to be in contact with the upper surface of the semiconductor layer 170. The TFT 900 is covered with a first insulating film ($SiO_2$) 11. The first insulating film 11 is disposed so as to be in contact with the channel region of the semiconductor layer 170 and the source and drain electrodes 9. The semiconductor layer 170 is subjected to an oxidation treatment in order to stabilize the characteristics. Here, as the oxidation treatment, a $N_2O$ plasma treatment at a temperature of 200° C. was performed after the formation of the semiconductor layer 170 and before the formation of the first insulating film 11. In addition, after the formation of the first insulating film 11, an annealing treatment was performed at a temperature of 250° C. or more.

FIG. 9(b) is a graph illustrating, as an example, the concentration profiles (in the thickness direction d of the semiconductor layer 170) of indium (In), gallium (Ga), zinc (Zn), oxygen (O), and silicon (Si) of a TFT including an In—Ga—Zn—O-based semiconductor forming the semiconductor layer 170. Here, as the In—Ga—Zn—O-based semiconductor, a semiconductor satisfying In:Ga:Zn=1:3:6 was used.

FIG. 9(c) is a graph illustrating, as an example, the concentration profiles (in the thickness direction of the semiconductor layer 170) of indium (In), tin (Sn), zinc (Zn), oxygen (O), and silicon (Si) of a TFT including an In—Sn—Zn—O-based semiconductor forming the semiconductor layer 170. As the In—Sn—Zn—O-based semiconductor, for example, a semiconductor substantially satisfying In:Sn:Zn=2:1:4 was used.

As illustrated in FIG. 9(b) and FIG. 9(c), the oxygen atom content in the $SiO_2$ is about 80%; the oxygen atom content (ratio) in the central portion in the thickness direction d of the In—Ga—Zn—O-based semiconductor layer is about 55%; and the oxygen atom ratio in the central portion in the thickness direction of the In—Sn—Zn—O-based semiconductor layer is about 50%.

As illustrated in FIG. 9(b) and FIG. 9(c), each TFT has, at the interface between the semiconductor layer 170 and the gate insulating layer 5, a region having a lower oxygen concentration than in the semiconductor layer 170; and this region substantially functions as a channel having a high carrier concentration.

On the other hand, regarding the atomic constituent ratio at the interface (on the back channel side) between the semiconductor layer 170 and the first insulating film 11, the following is found: in the In—Sn—Zn—O-based semiconductor TFT, as illustrated in FIG. 9(c), the Zn ratio increases at the interface between the semiconductor layer 170 and the first insulating film 11, which shows aggregation of Zn; in addition, with the increase in the Zn ratio, the oxygen atom content (oxygen concentration) considerably decreases. This phenomenon is scarcely observed in the In—Ga—Zn—O-based semiconductor TFT (FIG. 9(b)).

Incidentally, as described later, at the time immediately after formation of the first insulating film, the near-upper-surface region of the In—Ga—Zn—O-based semiconductor layer can also have a localized region having a low oxygen concentration. Subsequently, an annealing treatment is performed to oxidize the semiconductor layer, so that the region having a low oxygen concentration disappears. However, when an In—Sn—Zn—O-based semiconductor layer is used as the oxide semiconductor layer, in spite of the annealing treatment performed after formation of the first insulating film, as illustrated in FIG. 9(c), the region having a low oxygen concentration can remain.

As described above, in the In—Sn—Zn—O-based semiconductor TFT, the semiconductor layer 170 has a region having a low oxygen concentration in the near-surface region on the first insulating film 11-side (back channel side). In this example, on the back channel side, such a region is present that has a lower oxygen concentration than the region functioning as the channel. Such a region having a low oxygen concentration on the back channel side also functions as a channel, which results in an increase in the leakage current and desired TFT characteristics may not be achieved. In addition, there may be a case where application of a negative bias to the gate voltage cannot switch the channel to the off state (depression).

In the In—Sn—Zn—O-based semiconductor TFT (FIG. 9(c)), aggregation of Zn and a decrease in the oxygen concentration occur on the back channel side of the semiconductor layer 170, whereas this phenomenon does not occur in the In—Ga—Zn—O-based semiconductor TFT (FIG. 9(b)). The reason for this is probably as follows.

Figure 10:
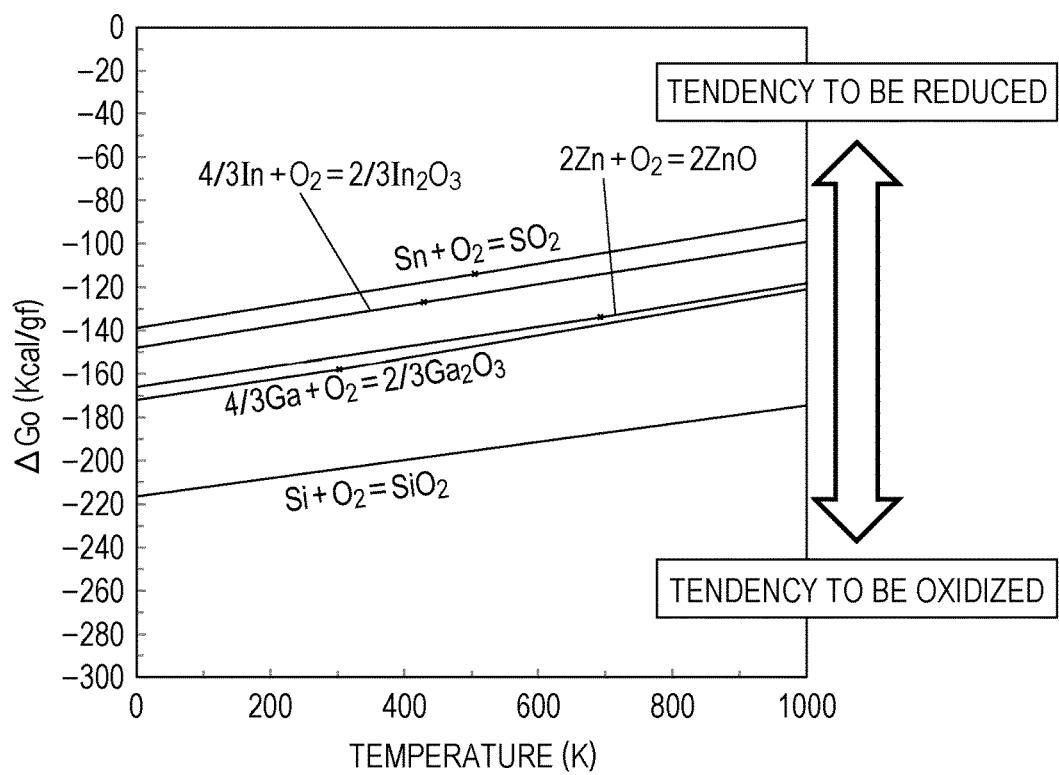
Figure 11:
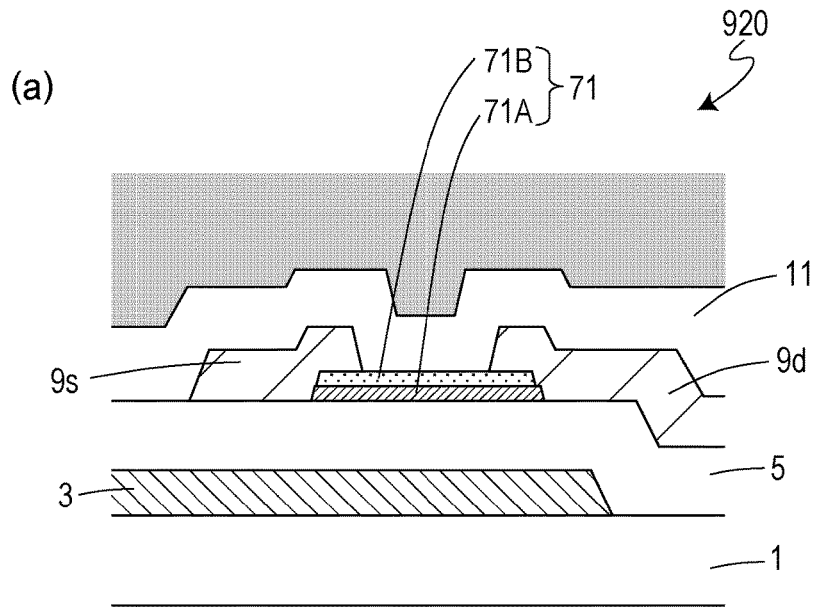
FIG. 11(a) is a sectional view schematically illustrating the configuration of a TFT 920 including a multilayer semiconductor layer.
FIG. 11(b) is a depth profile of elements of the TFT 920.
Figure 11:
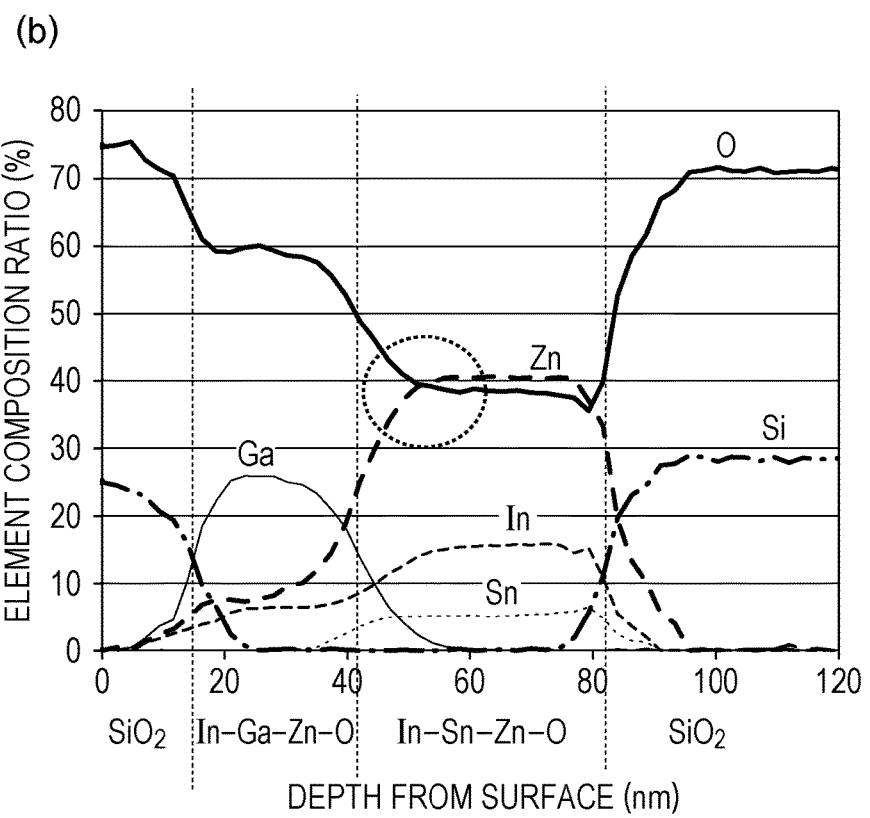

FIG. 10 is an Ellingham diagram illustrating the temperature dependence of the standard Gibbs energy of formation in Si, Ga, Sn, and In oxides. In FIG. 10, the ordinate axis indicates Gibbs free energy AGo, and the abscissa axis indicates absolute temperature. In this diagram, materials plotted in the lower area tend to be oxidized, while materials plotted in the upper area tend to be reduced. As is understood from FIG. 10, Si has a much stronger tendency to be oxidized than the metal elements forming the In—Sn—Zn—O-based semiconductor and the In—Ga—Zn—O-based semiconductor. The diagram also shows that Ga and Zn relatively tend to be oxidized, while Sn is a metal that tends to be reduced. In the In—Ga—Zn—O-based semiconductor TFT (FIG. 9(b)), at the interfaces in which the In—Ga—Zn—O-based semiconductor and $SiO_2$ are in contact with each other, Si dangling bonds in the $SiO_2$ deprive the In—Ga—Zn—O-based semiconductor of oxygens, and can bond to the oxygens. However, as illustrated in FIG. 10, the In—Ga—Zn—O-based semiconductor contains Ga and Zn, which tend to be oxidized, so that, in spite of the contact with $SiO_2$, the semiconductor exhibits relatively stable material characteristics. An increase in the Ga content can further enhance the stability of the In—Ga—Zn—O-based semiconductor. By contrast, in the In—Sn—Zn—O-based semiconductor TFT (FIG. 9(c)), the In—Sn—Zn—O-based semiconductor contains, instead of Ga, Sn, which tends to be reduced, so that the semiconductor tends to be reduced by the contact with $SiO_2$. As a result, compared with the In—Ga—Zn—O-based semiconductor TFT, in the In—Sn—Zn—O-based semiconductor TFT, metals such as Zn and Sn tend to be reduced and precipitated at the interface between the first insulating film 11 and the semiconductor layer 170. Such reduction of metals presumably results in a decrease in the oxygen concentration and an increase in the carrier concentration.

Incidentally, in the semiconductor layer 170 of the In—Sn—Zn—O-based semiconductor TFT, the upper surface and the lower surface of the semiconductor layer 170 are in contact with the $SiO_2$ layers; and, in each of the near-interface regions, aggregation of Zn occurs. The degree of aggregation of Zn is higher in the upper surface (back channel side surface) of the semiconductor layer 170 than in the lower surface. This is probably caused because, during formation of the first insulating film on the semiconductor layer 170, compared with the lower surface of the semiconductor layer 170, the upper surface tends to be damaged, so that more oxygen deficiencies are caused in the upper surface.

Accordingly, the inventors of the present invention studied a TFT structure that enables suppression of aggregation of Zn on the back channel side of the In—Sn—Zn—O-based semiconductor layer. As a result, the inventors have found that an In—Ga—Zn—O-based semiconductor layer is formed between the In—Sn—Zn—O-based semiconductor layer and the first insulating film, to thereby suppress aggregation of Zn.

FIG. 11(a) is a sectional view schematically illustrating the structure of a TFT 920, which was analyzed by the inventors of the present invention. In FIG. 11(a), elements similar to those in FIG. 9(a) are denoted by like reference signs. The TFT 920 includes a multilayer semiconductor layer 71 in which an In—Sn—Zn—O-based semiconductor layer 71A and an In—Ga—Zn—O-based semiconductor layer 71B are stacked in this order. The compositions of the In—Sn—Zn—O-based semiconductor and the In—Ga—Zn—O-based semiconductor are the same as in the semiconductors of TFTs illustrated in FIG. 9(b) and FIG. 9(c).

FIG. 11(b) is a graph illustrating results obtained by analyzing content ratios of elements in the semiconductor layer 71 of the oxide semiconductor TFT 920 by Auger electron spectroscopy. In FIG. 11(b), the abscissa axis indicates the depth from the surface of the first insulating film 11, and the ordinate axis indicates the content ratios of elements.

As is understood from the results illustrated in FIG. 11(b), when the In—Ga—Zn—O-based semiconductor layer 71B is formed between the In—Sn—Zn—O-based semiconductor layer 71A and the first insulating film 11, aggregation of Zn on the upper surface side of the In—Sn—Zn—O-based semiconductor layer 71A is suppressed, and a decrease in the oxygen concentration is suppressed. In this example, the oxygen concentration on the upper surface side of the In—Sn—Zn—O-based semiconductor layer 71A can be made higher than, for example, the oxygen concentration of a region (region functioning as the channel) near an interface with the gate insulating layer 5.

The Zn ratio of the In—Sn—Zn—C-based semiconductor layer 71A does not have a maximum value in the near-surface region on the back channel side, in other words, in a region near the interface with the In—Ga—Zn—O-based semiconductor layer 71B. The Zn ratio in the region near the interface with the In—Ga—Zn—O-based semiconductor layer 71B is almost the same as or less than (for example, 105% or less of the Zn ratio of the central portion) the Zn ratio of the central portion (in the thickness direction) of the In—Sn—Zn—C-based semiconductor layer 71A.

(Studies on Method for Manufacturing Oxide Semiconductor TFT)

Figure 12:
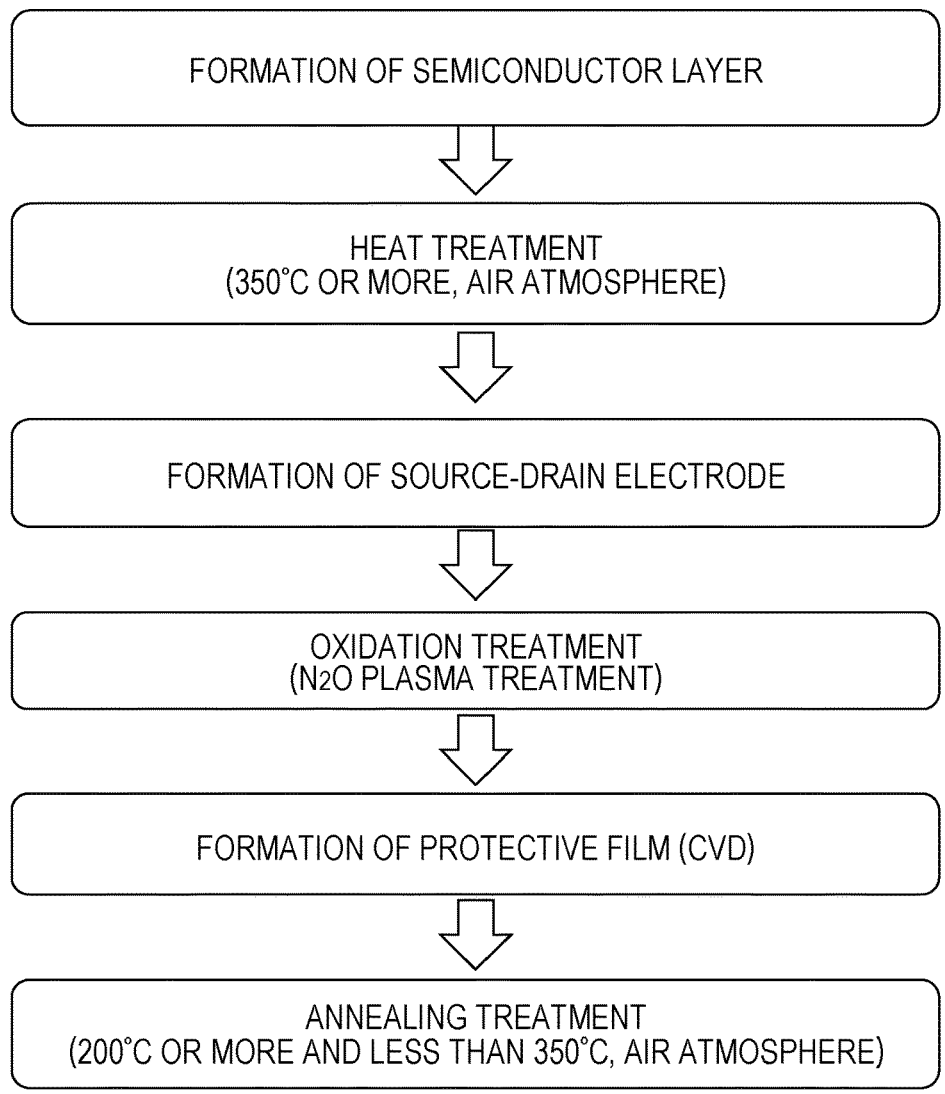
FIG. 12 illustrates an example of a method for manufacturing a TFT.

FIG. 12 illustrates an example of the process flow for an oxide semiconductor TFT.

As illustrated in FIG. 12, an oxide semiconductor film is first patterned to form an oxide semiconductor layer 7; and a heat treatment is performed, for example, at a temperature of 300° C. or more for 30 minutes or more. The temperature in the heat treatment may be 350° C. or more.

Subsequently, a source electrode 9s and a drain electrode 9d, which are in contact with the oxide semiconductor layer 7, are formed to provide a TFT 101. Subsequently, the oxide semiconductor layer 7 is subjected to an oxidation treatment such as a plasma treatment. As the oxidation treatment, for example, a plasma treatment using $N_2O$ gas may be performed. The treatment conditions are not particularly limited. The pressure of the $N_2O$ gas is set to, for example, 100 Pa or more and 300 Pa or less; a plasma power density is set to 0.2 W/cm² or more and 1.5 W/cm² or less; the treatment time is set to 5 to 100 sec; and the substrate temperature is set to, for example, 200° C. or more and 450° C. or less, preferably 200° C. or more and 350° C. or less, more preferably 200° C. or more and 300° C. or less. Incidentally, the oxidation treatment is not limited to the plasma treatment using $N_2O$ gas. The oxidation treatment can be performed by, for example, a plasma treatment using $O_2$ gas, or an ozone treatment. When such another treatment is performed, the preferred range of the treatment temperature is the same as the above-described range.

Subsequently, a first insulating film 11, which covers the TFT 101, is formed. Subsequently, an annealing treatment is performed, for example, at a temperature of 200° C. or more and less than 350° C. This causes oxidation of the oxide semiconductor layer 7, to thereby lower oxygen deficiencies in the oxide semiconductor layer 7 that are generated during formation of the first insulating film 11.

In the manufacturing method illustrated in FIG. 12, after formation of the protective film 11 and before the annealing treatment, a localized region having a low oxygen concentration is generated in the near-upper-surface region of the oxide semiconductor layer 7 (here, in the near-upper-surface region of the In—Ga—Zn—O-based semiconductor layer); in other words, the oxygen concentration (in the depth direction) of the In—Ga—Zn—O-based semiconductor layer probably has a minimum value in a region near the protective film 11-side surface. Subsequently, the annealing treatment is performed to oxidize the oxide semiconductor layer 7, so that, in the near-upper-surface region of the In—Ga—Zn—O-based semiconductor layer, the oxygen deficiencies are probably lowered and the oxygen concentration no longer has the minimum value.

The inventors of the present invention performed additional studies, and have found the following: even when an annealing treatment is performed after formation of the first insulating film 11, stable TFT characteristics may not be obtained depending on the annealing temperature. The results of the studies will be described later in detail. The annealing temperature is set to, for example, less than 350° C., preferably 300° C. or less. On the other hand, when the annealing temperature is low (for example, less than 200° C.), or when the annealing treatment is not performed after formation of the first insulating film 11, oxygen defects generated in the oxide semiconductor layer 7 during formation of the first insulating film 11 are difficult to sufficiently terminate in some cases. As a result, the region having a low oxygen concentration generated in the near-surface region of the oxide semiconductor layer 7 (here, the In—Ga—Zn—O-based semiconductor layer) may remain as it is, and desired TFT characteristics may not be obtained. Incidentally, the "annealing temperature" used in the Description denotes the temperature of the annealing treatment performed after formation of the first insulating film 11 unless otherwise specified.

(Results of Analysis of Semiconductor Layer 7 Having Multilayer Structure)

The inventors of the present invention prepared a plurality of Samples to be analyzed, by varying, for example, the composition of the In—Ga—Zn—O-based semiconductor, and the temperature of the annealing treatment after formation of the protective film; and the inventors evaluated the TFT characteristics of the Samples. The results will be described below.

The method for preparing Samples 1 to 6 to be analyzed is as follows. On a substrate, as a gate insulating layer, a SiNx layer (thickness: 325 nm) and a SiO$_2$ layer (thickness: 50 nm) were first formed in this order. Subsequently, as a first oxide semiconductor layer, an amorphous In—Sn—Zn—O-based semiconductor layer (thickness: 100 nm) was formed; and, as a second oxide semiconductor layer, a crystalline In—Ga—Zn—O-based semiconductor layer (thickness: 100 nm) in which the c axis was oriented substantially perpendicular to the layer surface was formed. The composition ratio In:Sn:Zn in the In—Sn—Zn—O-based semiconductor was substantially set to 2:1:4. The composition ratio In:Ga:Zn of the In—Ga—Zn—O-based semiconductor of each Sample was set to 1:1:1 or 1:3:6 as described in Table 1. Subsequently, an oxidation treatment was performed. The oxidation treatment was performed under conditions of a N$_2$O gas pressure of 200 Pa and a plasma power density of 1.0 W/cm$^2$. The time for each oxidation treatment was set to 30 seconds. Subsequently, as a protective film, a SiO$_2$ layer (thickness: 300 nm) was formed so as to cover the semiconductor layer. After the protective film was formed, an annealing treatment was performed. As described in Table 2, the annealing temperature was set to 250° C., 300° C., or 350° C.

TABLE 2

| Sample | Composition of In—Ga—Zn—O-based semiconductor (In:Ga:Zn) | Annealing temperature (° C.) | Threshold voltage Vth |
|---|---|---|---|
| 1 | 1:1:1 | 250 | 0.77 |
| 2 | 1:1:1 | 300 | 0.53 |
| 3 | 1:1:1 | 350 | Poor characteristics |
| 4 | 1:3:6 | 250 | 2.20 |
| 5 | 1:3:6 | 300 | 2.49 |
| 6 | 1:3:6 | 350 | Poor characteristics |

Evaluation of TFT Characteristics of Each Sample

Subsequently, TFTs were prepared under the same conditions as in the above-described Samples 1 to 6 to be analyzed, and the current-voltage characteristics thereof were evaluated.

Figure 14:
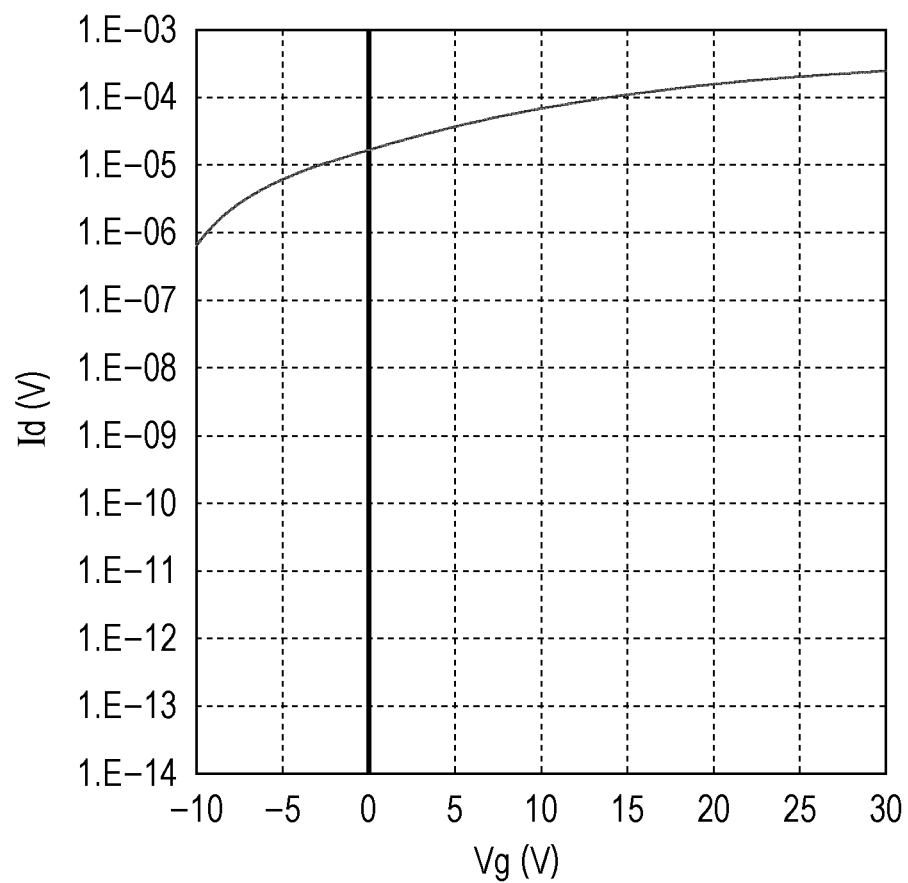
FIG. 14 is a graph illustrating the current-voltage characteristic of a TFT of Sample 6.
Figure 15:
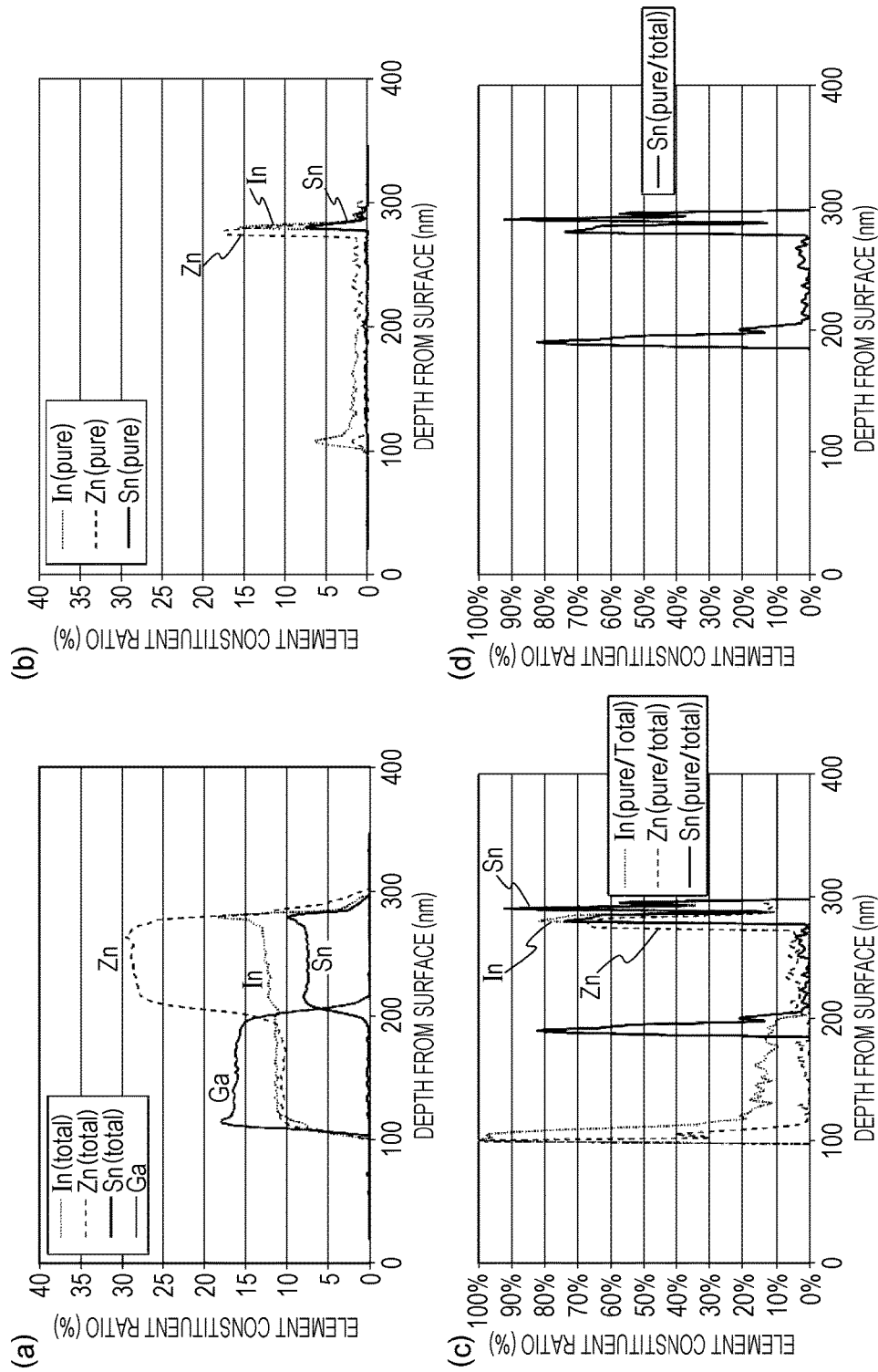
FIG. 15(a) is a graph illustrating the constituent ratios of the elements of Sample 1 in the depth direction.
FIG. 15(b) is a graph illustrating the constituent ratios of pure-state metals.
FIG. 15(c) is a graph illustrating the ratios of the amount of pure-state metals to the total amount of metals.
FIG. 15(d) is a graph illustrating the ratio of the amount of pure-state Sn to the total amount of Sn.
Figure 16:
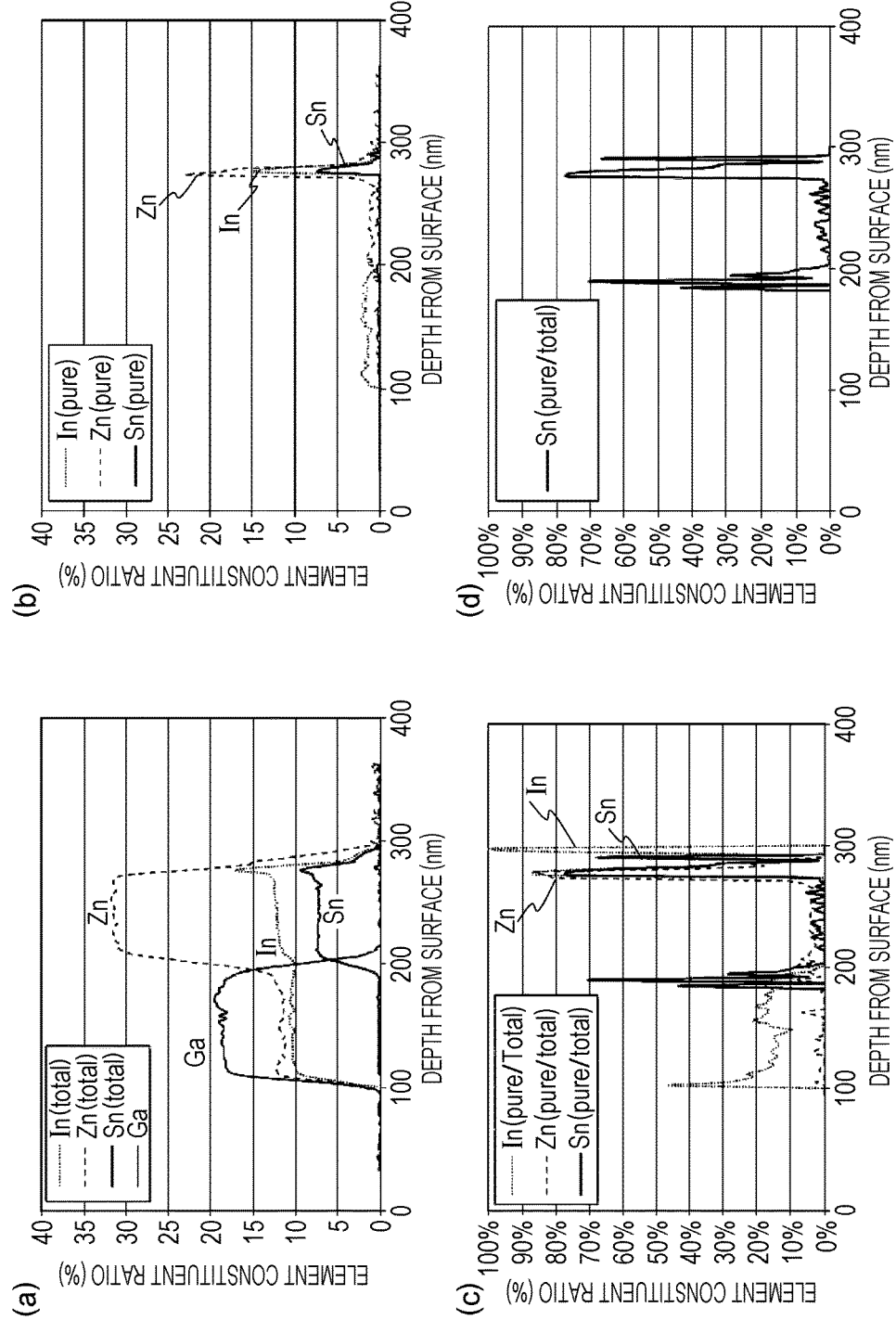
FIG. 16(a) is a graph illustrating the constituent ratios of the elements of Sample 2 in the depth direction.
FIG. 16(b) is a graph illustrating the constituent ratios of pure-state metals.
FIG. 16(c) is a graph illustrating the ratios of the amount of pure-state metals to the total amount of metals.
FIG. 16(d) is a graph illustrating the ratio of the amount of pure-state Sn to the total amount of Sn.
Figure 17:
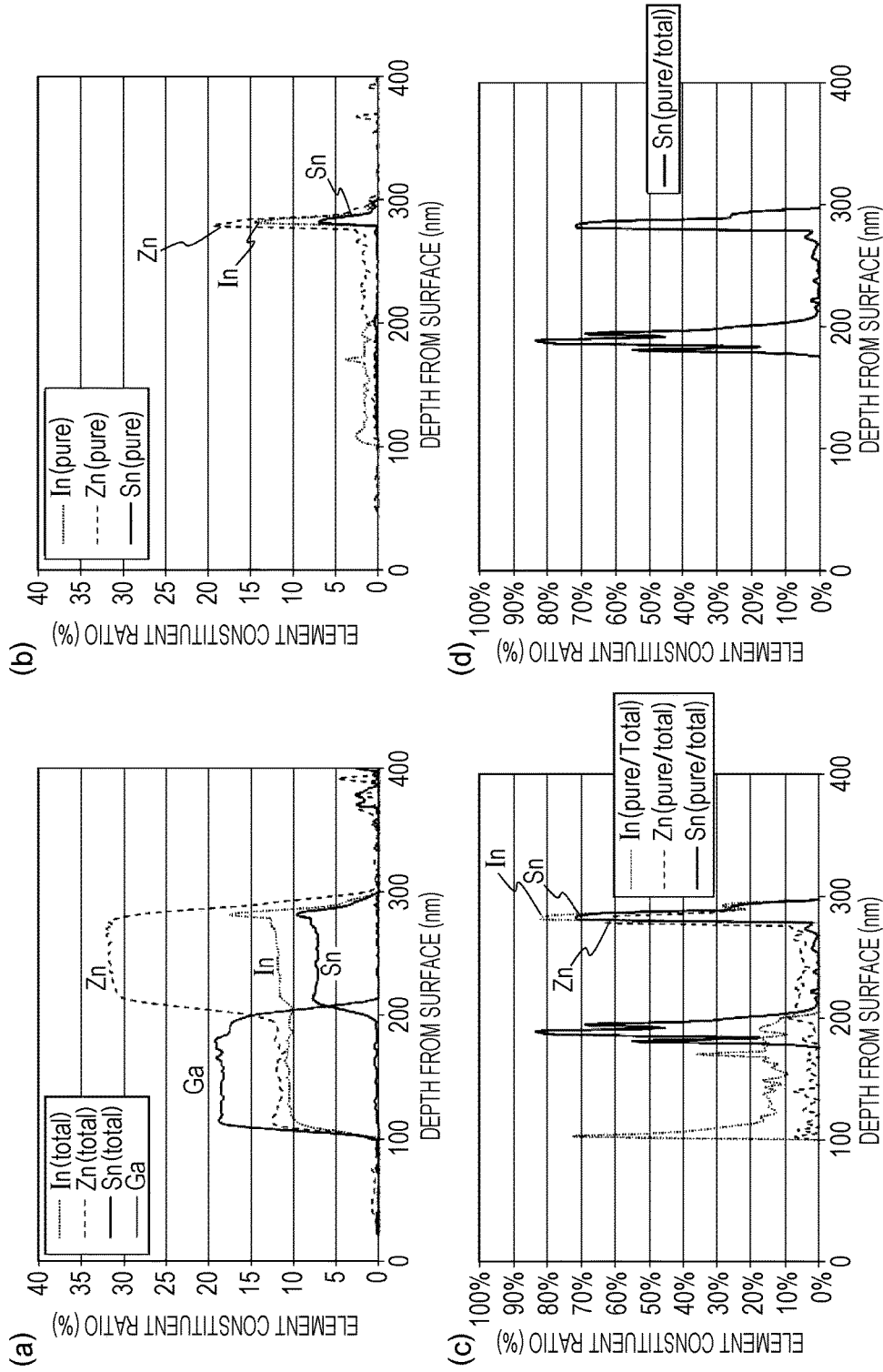
FIG. 17(a) is a graph illustrating the constituent ratios of the elements of Sample 3 in the depth direction.
FIG. 17(b) is a graph illustrating the constituent ratios of pure-state metals.
FIG. 17(c) is a graph illustrating the ratios of the amount of pure-state metals to the total amount of metals.
FIG. 17(d) is a graph illustrating the ratio of the amount of pure-state Sn to the total amount of Sn.
Figure 18:
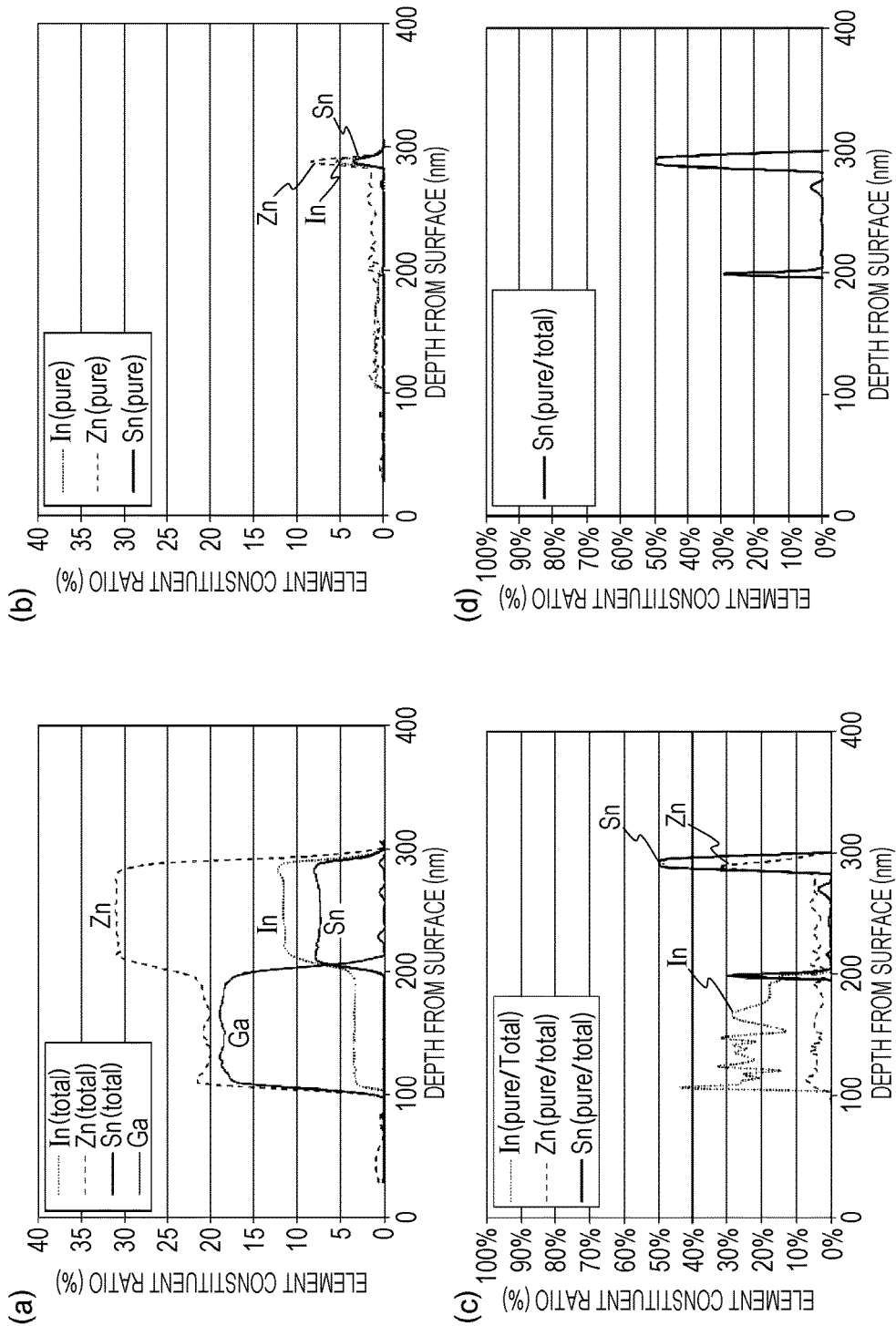
FIG. 18(a) is a graph illustrating the constituent ratios of the metal elements of Sample 4 in the depth direction.
FIG. 18(b) is a graph illustrating the constituent ratios of pure-state metals.
FIG. 18(c) is a graph illustrating the ratios of the amount of pure-state metals to the total amount of metals.
FIG. 18(d) is a graph illustrating the ratio of the amount of pure-state Sn to the total amount of Sn.
Figure 19:
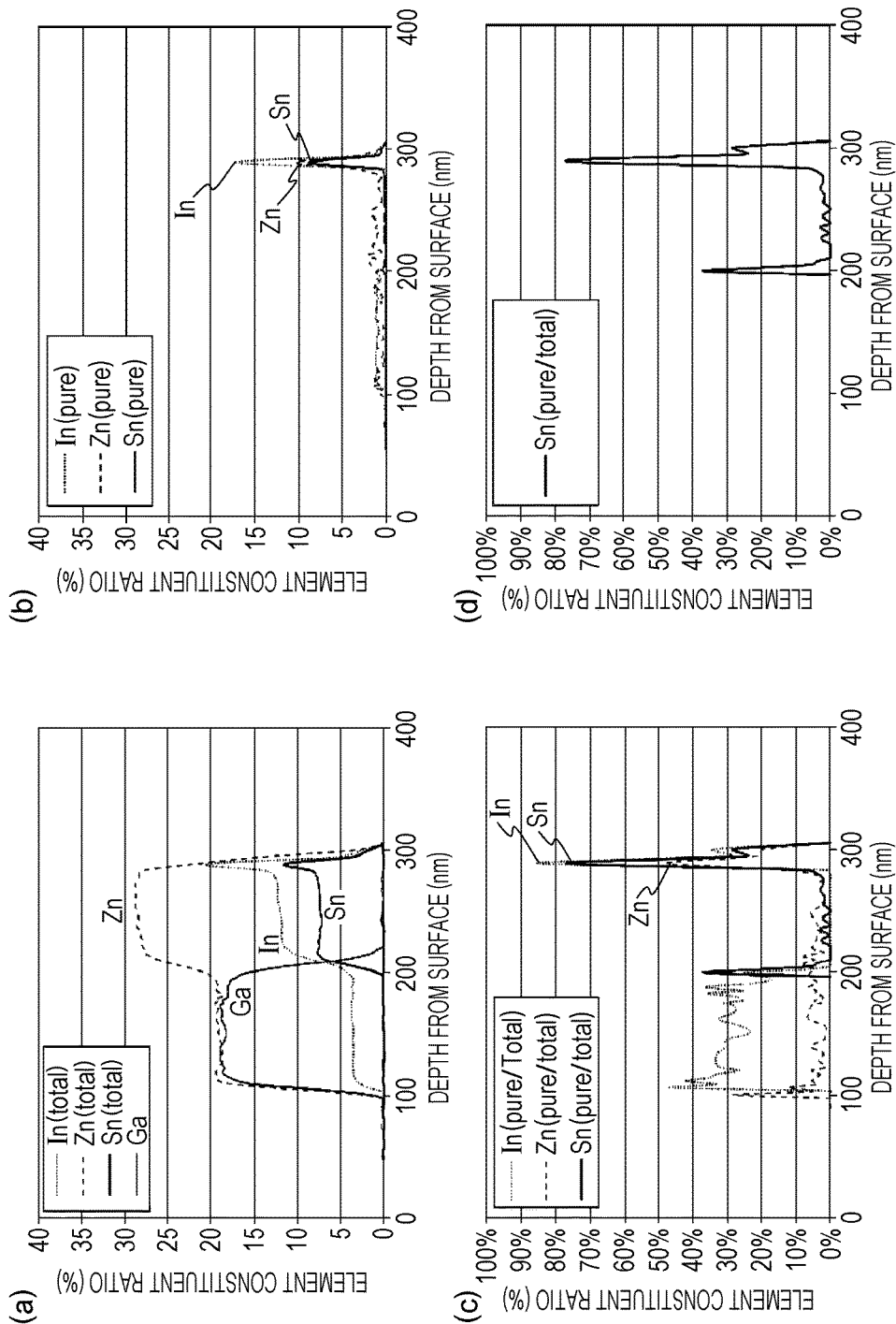
FIG. 19(a) is a graph illustrating the constituent ratios of the elements of Sample 5 in the depth direction.
FIG. 19(b) is a graph illustrating the constituent ratios of pure-state metals.
FIG. 19(c) is a graph illustrating the ratios of the amount of pure-state metals to the total amount of metals.
FIG. 19(d) is a graph illustrating the ratio of the amount of pure-state Sn to the total amount of Sn.
Figure 20:
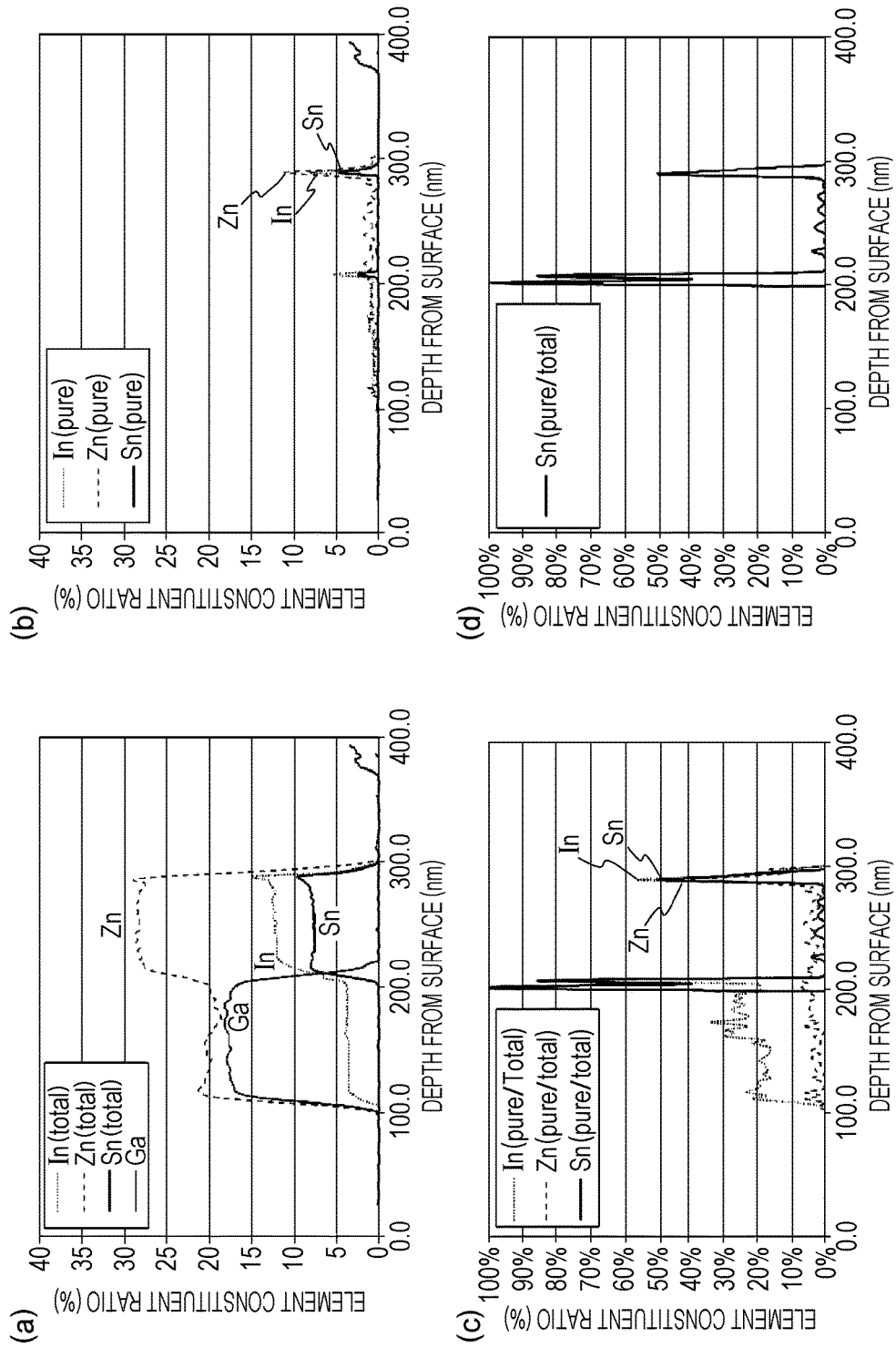
FIG. 20(a) is a graph illustrating the constituent ratios of the elements of Sample 6 in the depth direction.
FIG. 20(b) is a graph illustrating the constituent ratios of pure-state metals.
FIG. 20(c) is a graph illustrating the ratios of the amount of pure-state metals to the total amount of metals.
FIG. 20(d) is a graph illustrating the ratio of the amount of pure-state Sn to the total amount of Sn.

The threshold voltage Vth of each Sample is described in Table 2. As is understood from the results, Samples 1, 2, 4, and 5 exhibit good TFT characteristics; and Samples 4 and 5 provide higher threshold voltages Vth than Samples 1 and 2. On the other hand, Samples 3 and 6 were evaluated as having "Poor characteristics" because application of a negative bias to the gate voltage did not switch the channel to the off state (refer to FIG. 14).

Thus, it has been demonstrated that high annealing temperatures (350° C. or more) tend to result in degradation of the TFT characteristics. It has also been demonstrated that, compared with Samples 1 and 2 in which the composition ratio of the In—Ga—Zn—O-based semiconductor is 1:1:1, Samples 4 and 5 in which the composition ratio is 1:3:6 provide stable TFT characteristics.

Depth Profile of Metal Content Ratios of Each Sample

Subsequently, elements in Samples 1 to 6 were analyzed in the depth direction by Auger electron spectroscopy. In the analysis, the bonding states of metals were also analyzed. In the following description, a metal having an oxide bonding state (metal forming a metal oxide) will be referred to as an "oxide-state metal"; and a metal having a metallic bonding state will be referred to as a "pure-state metal". For example, regarding indium, an indium forming In$_2$O$_3$ will be referred to as an "oxide-state In"; and a metal indium will be referred to as a "pure-state In". A metal M in the oxide state, a metal M in the pure state, and metals M in all the bonding states will be sometimes respectively represented by "M (oxide)", "M (pure)", and "M (total)".

FIG. 15 to FIG. 20 are graphs respectively illustrating analysis results of the constituent ratios of metal elements in the depth direction of Samples 1 to 6. The abscissa axis indicates the depth from the upper surface of Sample (the upper surface of the SiO$_2$ layer). In each of the graphs, (a) indicates the constituent ratios of elements in the depth direction. These constituent ratios are each the constituent ratio of the total amount of a metal in the pure state and in the oxide state: In (total), Sn (total), Zn (total), and Ga (total). In each of the graphs, (b) indicates the constituent ratios of pure-state metals: In (pure), Sn (pure), and Zn (pure). In each of the graphs, (c) indicates, for each metal, the ratio of the amount of the pure-state metal to the total amount of the metal. In each of the graphs, (d) indicates the ratio of the amount of the pure-state Sn to the total amount of Sn.

As illustrated in FIG. 15(a) to FIG. 20(a), in each Sample, the In—Ga—Zn—O-based semiconductor layer formed between the In—Sn—Zn—O-based semiconductor layer and the $SiO_2$ layer enables suppression of aggregation of Zn on the upper surface side of the In—Sn—Zn—O-based semiconductor layer. In addition, it has been demonstrated that, in each Sample, the In—Ga—Zn—O-based semiconductor layer contains the pure-state In in an amount of 10% or more (for example, about 10% to about 30%); the In—Sn—Zn—O-based semiconductor layer contains the pure-state In in an amount of less than 10% (here, several percent or less); and the In in the In—Sn—Zn—O-based semiconductor layer is mostly in the oxide state. This shows that the In—Sn—Zn—O-based semiconductor layer remains, in its thickness direction, in the oxide state without being reduced.

As is understood from the analysis results of pure-state metal constituent ratios illustrated in FIG. 20(b) and FIG. 20(c), in Sample 6, pure-state In and Sn precipitate at the interface between the In—Ga—Zn—O-based semiconductor layer and the In—Sn—Zn—O-based semiconductor layer. This phenomenon is not observed in the analysis results of the other Samples illustrated in FIG. 15(b) to FIG. 19(b). Thus, in Sample 6, annealing at a high temperature (350° C.) probably caused generation of a low-crystallinity region at the interface between the In—Ga—Zn—O-based semiconductor and the In—Sn—Zn—O-based semiconductor; and, in this region, the pure-state metals precipitated.

Comparisons between Samples will be performed in terms of a pure-state Sn ratio of Sn (pure)/Sn (total) at the interface between the In—Ga—Zn—O-based semiconductor layer and the In—Sn—Zn—O-based semiconductor layer. As illustrated in FIG. 15(d) to FIG. 20(d), in Sample 4 and Sample 5, the ratios are 40% or less, whereas the ratio is 100% in Sample 6, in which the oxidation treatment was performed at a higher temperature. In Samples 1 to 3 in which the composition of the In—Ga—Zn—O-based semiconductor satisfies 1:1:1, the ratios are each 70% or more and 90% or less. Samples 4 and 5 have lower Sn (pure)/Sn (total) than Samples 1 to 3. This is probably because the In—Ga—Zn—O-based semiconductor layers in Samples 4 and 5 contain large amounts of Ga and Zn, which are less likely to be reduced (refer to FIG. 10). In summary, the following has been demonstrated: when the pure-state Sn ratio of Sn (pure)/Sn (total) at the interface between the In—Ga—Zn—O-based semiconductor layer and the In—Sn—Zn—O-based semiconductor layer is, for example, 0% or more and 90% or less, degradation of TFT characteristics can be suppressed. More preferably, the ratio is 40% or less, which provides desired TFT characteristics with more certainty.

In Sample 3, compared with the other Samples, a region having a relatively high pure-state Sn ratio (for example, 50% or more) of Sn (pure)/Sn (total) at the interface between the In—Ga—Zn—O-based semiconductor layer and the In—Sn—Zn—O-based semiconductor layer extends widely in the thickness direction. In this example, the region having a Sn (pure)/Sn (total) of 50% or more has a thickness of about 10 nm. Thus, compared with Samples 1 and 2, although the maximum value of Sn (pure)/Sn (total) is almost the same, the amount of pure-state Sn precipitated is large; this may result in a decrease in the threshold voltage Vth.

From the above-described results, the following has been demonstrated: when, at the interface between the In—Ga—Zn—O-based semiconductor layer and the In—Sn—Zn—O-based semiconductor layer, the Sn (pure)/Sn (total) is 90% or less and a region having a Sn (pure)/Sn (total) of 50% or more has a thickness of less than 10 nm, more stable TFT characteristics can be obtained.

From the constituent ratios of the metal elements at the interface between the In—Sn—Zn—O-based semiconductor layer and the $SiO_2$ layer, the following is understood. As illustrated in FIGS. 15(c) and (d) to FIGS. 20(c) and (d), in each Sample, at the interface between the In—Sn—Zn—O-based semiconductor and the $SiO_2$ layer, pure-state In, Zn, and Sn precipitated. In Samples 4 to 6 in which the In—Ga—Zn—O-based semiconductor composition ratio satisfies In:Ga:Zn=1:3:6, the pure-state In, Zn, and Sn ratios are lower than those in Samples 1 to 3 satisfying In:Ga:Zn=1:1:1. As illustrated in FIG. 18(c) to FIG. 20(c), for example, in Samples 4 to 6, the ratio of Zn (pure) to Zn (total) at the interface between the In—Sn—Zn—O-based semiconductor and the $SiO_2$ layer is suppressed to 50% or less. As illustrated in FIG. 18(b) to FIG. 20(b), the content ratio of pure-state Zn at the interface between the In—Sn—Zn—O-based semiconductor and the $SiO_2$ layer is, for example, 15% or less. This is probably because the In—Ga—Zn—O-based semiconductor layers of Samples 4 to 6 contain large amounts of Ga and Zn, which are less likely to be reduced (refer to FIG. 10), and have high blocking capabilities against plasma damage during formation of the protective film. This result indicates that, when the In—Ga—Zn—O-based semiconductor has a low Ga or Zn composition ratio and a high In composition ratio, pure-state Sn and In tend to precipitate, in other words, a region to be reduced tends to be generated. Thus, oxygen deficiencies that cause a decrease in the resistance probably tend to be generated.

For example, in Samples 1 to 3, the ratio of the number of Ga atoms to the number of all the metal element atoms in the In—Ga—Zn—O-based semiconductor ([Ga]/[In]+[Ga]+[Zn], hereafter, simply "Ga composition ratio") is the same as the ratio of the number of In atoms to the number of all the metal element atoms ([In]/[In]+[Ga]+[Zn], hereafter, simply "In composition ratio"); however, in Samples 4 to 6, the Ga composition ratio is three times the In composition ratio. In this way, by increasing the Ga composition ratio in the In—Ga—Zn—O-based semiconductor, the reduction resistance of the semiconductor layer can be enhanced. The Ga composition ratio may be higher than the In composition ratio (Ga>In). The Ga composition ratio relative to all the metal elements in the In—Ga—Zn—O-based semiconductor may be more than ⅓.

Incidentally, for example, the conditions of the oxidation treatment, the annealing temperature, and the compositions and the thicknesses of the semiconductor layers are not limited to the above-described examples and can be variously modified. Even when the foregoing are modified, as long as the depth profiles of the elements satisfy the above-described relationship, similar advantages are provided. For example, when, at the interface between the first oxide semiconductor layer containing In, Sn, and Zn and the second oxide semiconductor layer containing In and Ga, the pure-state Sn ratio of Sn (pure)/Sn (total) is suppressed to 90% or less, preferably 40% or less, degradation of the TFT characteristics can be suppressed. Such a configuration can be achieved by, for example, setting the Ga ratio to be higher than the In ratio in the second oxide semiconductor layer, or by setting the annealing temperature to be, for example, less than 350° C., preferably 300° C. or less. Incidentally, conditions other than the annealing temperature and the composition ratios of the In—Ga—Zn—O-based semiconductor, such as the time for the oxidation treatment and the thicknesses of the In—Ga—Zn—O-based semiconductor layer and the In—Sn—Zn—O-based semiconductor layer, may be appropriately modified as long as the above-described relationship is satisfied (Sn (pure)/Sn (total) 90%), so that similar advantages can be provided.

(Relationship Between Composition of Second Oxide Semiconductor Layer and Threshold Voltage of TFT)

Subsequently, the relationship between the composition of the second oxide semiconductor layer and the threshold voltage was examined.

TFTs of Examples 1 to 3 were first prepared that employed an In—Sn—Zn—C-based semiconductor layer (thickness: 35 nm) as the first oxide semiconductor layer and an In—Ga—Zn—O-based semiconductor layer (thickness: 35 nm) as the second oxide semiconductor layer. In Examples 1 to 3, the composition ratios In:Ga:Zn of the In—Ga—Zn—O-based semiconductor layers are described in Table 3. After formation of the protective film, annealing was performed at a temperature of 300° C. and the heat treatment time was set to 1 hour.

For comparison, a TFT of Comparative Example was prepared that employed an active layer constituted by an In—Sn—Zn—O-based semiconductor monolayer (thickness: 35 nm). The annealing conditions were the same as in Examples 1 to 3.

The current-voltage characteristics of the TFTs of Examples 1 to 3 and Comparative Example 1 were examined. The results are described in Table 3 and FIG. 21(a) to FIG. 21(d).

TABLE 3

| | Composition of second oxide semiconductor layer In:Ga:Zn | Threshold voltage Vth [V] | Mobility μ [cm²/Vs] |
|---|---|---|---|
| Example 1 | 1:1:1 | 0.77 | 21.7 |
| Example 2 | 1:3:2 | 1.72 | 20.3 |
| Example 3 | 1:3:6 | 2.49 | 18.6 |
| Comparative Example 1 | — | −2.48 | 38.3 |

Figure 21:
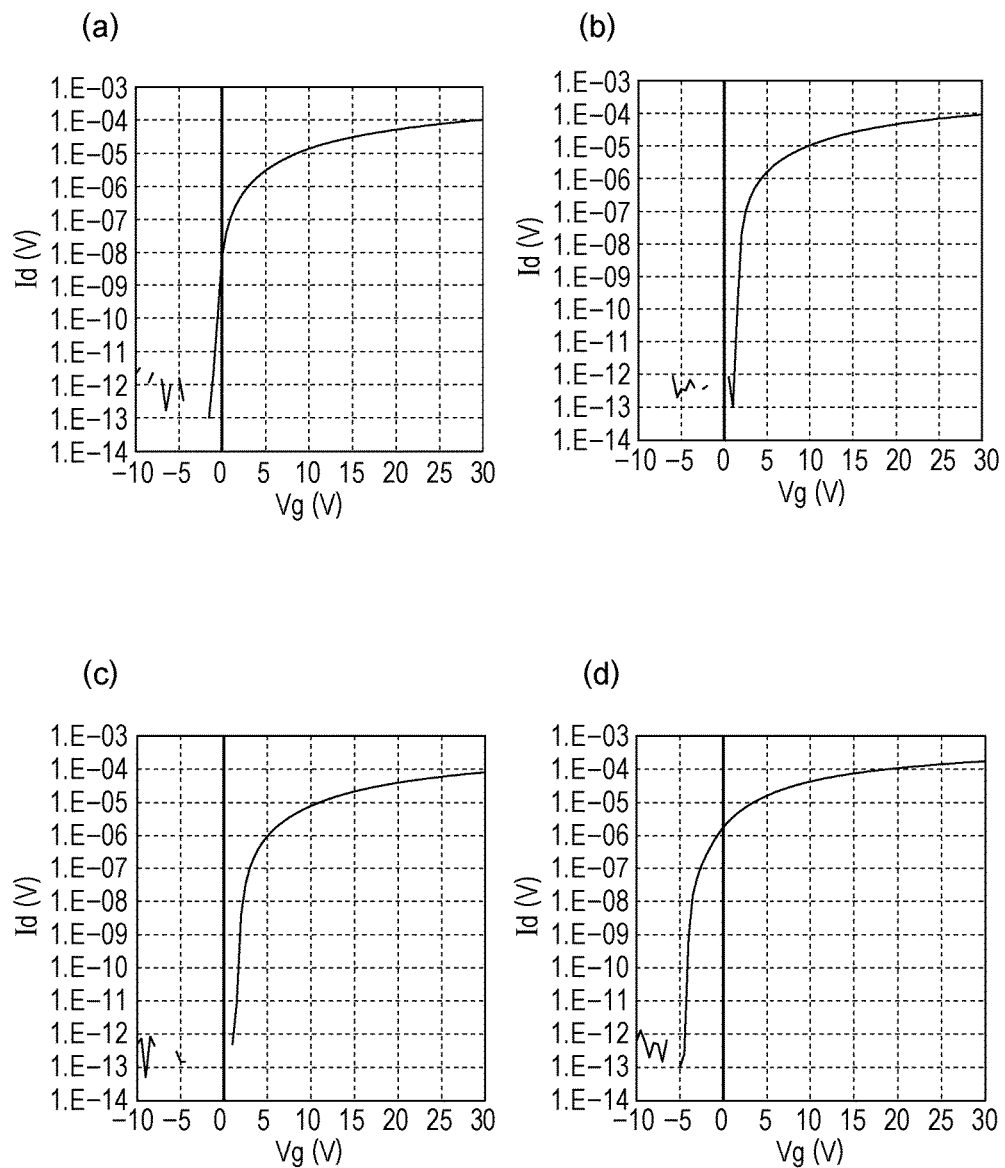
FIG. 21(a) to FIG. 21(d) are graphs respectively illustrating the current-voltage characteristics of TFTs of Examples 1 to 3 and Comparative Example 1.

As illustrated in FIG. 21(d), the TFT of Comparative Example 1 employing the In—Sn—Zn—C-based semiconductor monolayer as the active layer has normally-on characteristics in which off characteristics are not provided even at Vg=0 V. This is probably because, as described above with reference to FIG. 9, a reduction reaction occurs on the back channel side of the In—Sn—Zn—C-based semiconductor layer, and a decrease in the oxygen concentration occurs, which results in an increase in the carrier concentration. By contrast, the TFTs of Examples 1 to 3 having a multilayer structure including an In—Ga—Zn—O-based semiconductor layer and an In—Sn—Zn—O-based semiconductor layer have normally-off characteristics. This is probably because the In—Ga—Zn—O-based semiconductor layer is disposed to suppress the reduction reaction occurring on the back channel side of the In—Sn—Zn—O-based semiconductor layer, which results in suppression of the increase in the resistivity of the active layer.

For example, comparisons between the current-voltage characteristics of the TFTs of Examples 1 to 3 have revealed the following. The lower the In composition ratio relative to all the metal elements ([In]/([In]+[Ga]+[Zn]) in the In—Ga—Zn—O-based semiconductor layers, in other words, the higher the Ga or Zn ratio, the larger the absolute value of Vth, which provides stable characteristics. In addition, by varying the composition of the In—Ga—Zn—O-based semiconductor layer, the threshold voltage (Vth) can be controlled.

As described above, the composition of the second oxide semiconductor layer can be selected in accordance with the desired threshold voltage. Incidentally, in the second oxide semiconductor layer, when the In composition ratio ([In]/([In]+[Ga]+[Zn]) relative to all the metal elements is, for example, ⅙ or less, preferably 1/10 or less, more stable current-voltage characteristics can be achieved.

The second oxide semiconductor layer may contain an oxide semiconductor other than In—Ga—Zn—O-based semiconductors: for example, an In—Ga—O-based semiconductor. In this case, in the In—Ga—O-based semiconductor, the Ga composition ratio may be higher than the In composition ratio; in other words, the In composition ratio [In]/([In]+[Ga]) may be less than ½. This provides more stable characteristics.

As is understood from the above-described analysis results, in the oxide semiconductor layer 7 of the TFTs 102 and 103 (FIG. 4 and FIG. 8), the Zn ratio in the depth direction of the first oxide semiconductor layer 7A preferably does not have a maximum value in a region near the second oxide semiconductor layer 7B-side surface. In addition, at the interface between the first oxide semiconductor layer 7A and the second oxide semiconductor layer 7B, the metallic Sn ratio relative to the total Sn amount may be 0% or more and 90% or less; and, at the interface, a region in which the metallic Sn ratio relative to the total Sn amount is 50% or more may have a thickness of less than 10 nm. The "metallic Sn" denotes a Sn in the metallic bonding state, which can be generated by, for example, reduction of Sn forming an oxide. The "metallic Sn ratio relative to the total Sn amount" denotes the ratio of metallic Sn to the total Sn amount of the Sn forming an oxide (Sn in the oxide bonding state) and the metallic Sn. Thus, at the interface between the first oxide semiconductor layer 7A and the second oxide semiconductor layer 7B, a decrease in the oxygen concentration of the oxide semiconductor layer 7 due to reduction of the metal is suppressed. Accordingly, an increase in the carrier concentration in a region near the back channel side surface of the first oxide semiconductor layer 7A can be suppressed, so that stable TFT characteristics can be achieved.

At the interface between the first oxide semiconductor layer 7A and the second oxide semiconductor layer 7B, the ratio of metallic Sn to the whole Sn is preferably 40% or less. In this case, the decrease in the oxygen concentration due to reduction of Sn can be more effectively suppressed, so that more stable TFT characteristics can be achieved.

The channel region of the TFT may be in contact with an oxygen-containing insulating film such as an oxide film, for example, a $SiO_2$ film. In this example, the first insulating film 11 is a $SiO_2$ film. Incidentally, the first insulating film 11 may be a multilayer film including a $SiO_2$ film as a lower layer.

The composition of the oxide semiconductor contained in the second oxide semiconductor layer 7B is not particularly limited. In the oxide semiconductor, the Ga composition ratio may be higher than the In composition ratio. In the oxide semiconductor, the Zn composition ratio may be higher than the In composition ratio. When the content of Ga and/or Zn, which are less reducible, is made higher than the content of In, which is more reducible, generation of oxygen defects due to reduction of metals can be more effectively suppressed.

Figure 13:
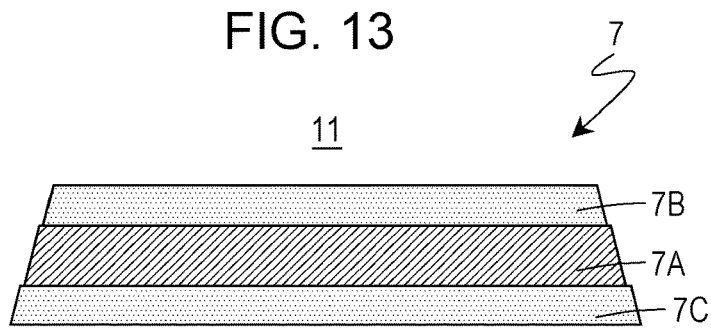
FIG. 13 is a sectional view illustrating another example of a semiconductor layer having a multilayer structure.

The oxide semiconductor layer 7 in this embodiment is not limited to the bilayer structure described as an example, and may have a multilayer structure of three or more layers including the first oxide semiconductor layer 7A and the second oxide semiconductor layer 7B. For example, as illustrated in FIG. 13, a third oxide semiconductor layer 7C, which contains In and Ga and does not contain Sn, may be further included on the gate insulating layer 5-side of the first oxide semiconductor layer 7A. In this case, also at the interface between the first oxide semiconductor layer 7A and the gate insulating layer 5, reduction of Zn, Sn, and In can be suppressed, to thereby suppress degradation of characteristics due to an increase in oxygen defects. As a result, the TFT characteristics can be further stabilized.

The TFTs in the above-described embodiments have a channel etch structure. In the "channel-etch TFT", an etch stop layer is not formed on the channel region, and the channel-side end portions of the source-drain electrode 9 are disposed so as to be in contact with the upper surface of the oxide semiconductor layer 7. The channel-etch TFT is formed by, for example, forming a conductive film for the source-drain electrode on the oxide semiconductor layer 7, and dividing the film into the source and the drain. In this source-drain division step, the surface portion of the channel region may be etched. In order to reduce the amount of damage to the oxide semiconductor layer 7 in the source-drain division step, after formation of the oxide semiconductor layer 7 and before formation of the first insulating film 11, an oxidation treatment such as a $NO_2$ plasma treatment may be performed.

In the TFTs in the above-described embodiments, the gate electrode 3 is disposed on the substrate 1-side of the oxide semiconductor layer 7 (bottom-gate structure); alternatively, the gate electrode 3 may be disposed over the oxide semiconductor layer 7 (top-gate structure). The TFTs in the above-described embodiments may have an etch stop structure including an etch stop covering the channel region. As the etch stop layer, an oxygen-containing insulating layer such as a $SiO_2$ layer is used. In a TFT having the etch stop structure, the channel-side end portions of the source-drain electrode are disposed on, for example, the etch stop layer. The etch stop TFT is formed by, for example, forming an etch stop layer that covers a portion (that is to be the channel region) of the upper surface of the semiconductor layer; subsequently forming a conductive film for the source-drain electrode on the semiconductor layer and the etch stop layer; and dividing the film into the source and the drain. Such a TFT having the etch stop structure also provides the same advantages as above as long as it includes the above-described semiconductor layer having a multilayer structure.

The TFTs in the above-described embodiments may have a top-contact structure in which the source-drain electrode is in contact with the top surface of the semiconductor layer, or may have a bottom-contact structure in which the source-drain electrode is in contact with the bottom surface of the semiconductor layer. Incidentally, in the case of forming an active layer having a multilayer structure (oxide semiconductor layer 7), regardless of the structure of the TFT, the above-described advantages are provided as long as a semi-conductor layer is included that has a multilayer structure including a first oxide semiconductor layer and a second oxide semiconductor layer disposed on the back channel side of the first oxide semiconductor layer. The phrase "disposed on the back channel side of the first oxide semiconductor layer" means that the second oxide semiconductor layer is disposed on a surface opposite to the gate insulating layer-side surface of the first oxide semiconductor layer.

In existing In—Sn—Zn—O-based semiconductor TFTs having a top-gate structure, when an oxygen-containing insulating film such as a $SiO_2$ layer is disposed, as an underlying film, on the lower surface of the semiconductor layer, a decrease in the oxygen concentration may be caused on the underlying film side (back channel side) of the In—Sn—Zn—O-based semiconductor layer, and an increase in the carrier concentration may be caused. By contrast, a second oxide semiconductor layer 7B such as an In—Ga—Zn—O-based semiconductor layer is disposed on the back channel side of the first oxide semiconductor layer 7A, so that the increase in the carrier concentration on the back channel side of the oxide semiconductor layer 7 can be suppressed, to thereby suppress, for example, an increase in the off-leakage current and degradation of the TFT characteristics.

As is understood from FIG. 9(c), in existing In—Sn—Zn—O-based semiconductor TFTs, the problem caused by a decrease in the oxygen concentration (aggregation of Zn) on the back channel side of the In—Sn—Zn—O-based semiconductor layer seriously occurs particularly in bottom-gate structure TFTs having a channel etch structure. This is probably because, during the oxidation treatment such as a $N_2O$ plasma treatment, a stronger interaction occurs between the upper surface portion of the In—Sn—Zn—O-based semiconductor layer and the $SiO_2$ layer, which results in a further decrease in the oxygen concentration; and because, in the upper surface of the In—Sn—Zn—O-based semiconductor layer, oxygen defects tend to be generated by damage during the oxidation treatment. Thus, when the oxide semiconductor TFT of this embodiment has a channel etch structure, more significant advantages can be provided.

INDUSTRIAL APPLICABILITY

Embodiments according to the present invention are widely applicable to apparatuses including thin-film transistors, for example, circuit substrates such as active matrix substrates; display apparatuses such as liquid crystal display apparatuses, organic electroluminescence (EL) display apparatuses, and inorganic electroluminescence display apparatuses; image capturing devices such as image sensor devices; and electronic devices such as image input devices and fingerprint recognition devices.

REFERENCE SIGNS LIST 1 substrate
3 gate electrode
5 gate insulating layer
7 oxide semiconductor layer
7A first oxide semiconductor layer
7B second oxide semiconductor layer
8 metal oxide layer
8A first metal oxide layer
8B second metal oxide layer
9d drain electrode
9s source electrode
11 first insulating film 11a inorganic insulating film
11b organic insulating film
12 second insulating film
13 interlayer insulating layer
15 transparent conductive layer (pixel electrode)
17 contact section
21 and 22 openings
31 oxide semiconductor layer
31A first oxide semiconductor layer
31B second oxide semiconductor layer
70c conductor region
70i semiconductor region
201, 202, and 203 storage capacitors
1001, 1002, 1003, and 1004 semiconductor devices

The invention claimed is:

1. A semiconductor device comprising:
a substrate;
a thin-film transistor supported by the substrate and including a gate electrode, an oxide semiconductor layer, a gate insulating layer positioned between the gate electrode and the oxide semiconductor layer, and a source electrode and a drain electrode that are electrically connected to the oxide semiconductor layer;
a metal oxide layer including a conductor region, and formed from an oxide film from which the oxide semiconductor layer is also formed;
an interlayer insulating layer covering the thin-film transistor and the metal oxide layer; and
a transparent conductive layer disposed on the interlayer insulating layer and electrically connected to the drain electrode, wherein
the oxide semiconductor layer and the metal oxide layer contain indium, tin, and zinc,
the transparent conductive layer overlaps at least a portion of the conductor region with the interlayer insulating layer therebetween,
the interlayer insulating layer includes
a first insulating film covering the thin-film transistor and the metal oxide layer, and having an opening above the conductor region of the metal oxide layer, and
a second insulating film formed on the first insulating film and within the opening, and being in contact with, within the opening, the conductor region of the metal oxide layer, and
the transparent conductive layer overlaps the at east a portion of the conductor region with the second insulating film therebetween.

2. The semiconductor device according to claim 1, wherein the second insulating film is a reducing insulating film having a property of reducing an oxide semiconductor contained in the oxide semiconductor layer.

3. The semiconductor device according to claim 1, wherein the first insulating film includes an organic insulating film.

4. The semiconductor device according to claim 1, wherein the gate electrode is disposed on a side of the oxide semiconductor layer, the side being closer to the substrate, and
the oxide semiconductor layer has a multilayer structure including a first semiconductor layer containing indium, tin, and zinc, and a second semiconductor layer formed on the first semiconductor layer and containing indium and gallium.

5. The semiconductor device according to claim 4, wherein the metal oxide layer includes a first oxide layer formed from an oxide film from which the first semiconductor layer is also formed, and the second insulating film is in contact with, within the opening, the first oxide layer.

6. The semiconductor device according to claim 4, wherein the at least a portion of the metal oxide layer has a multilayer structure including a first oxide layer formed from an oxide film from which the first semiconductor layer is also formed, and a second oxide layer formed from an oxide film from which the second semiconductor layer is also formed, and the conductor region is formed in at least a portion of the first oxide layer and in at least a portion of the second oxide layer.

7. The semiconductor device according to claim 4, wherein the first semiconductor layer contains an In—Sn—Zn—O-based oxide, and the second semiconductor layer contains an In—Ga—Zn—O-based oxide.

8. The semiconductor device according to claim 1, wherein the gate electrode is disposed on a side of the oxide semiconductor layer, the side being closer to the substrate,
the oxide semiconductor layer is constituted solely by a first semiconductor layer containing indium, tin, and zinc, and
the metal oxide layer is constituted solely by a first oxide layer formed from an oxide film from which the first semiconductor layer is also formed.

9. The semiconductor device according to claim 8, further comprising another thin-film transistor, the other thin-film transistor including an active layer having a multilayer structure including a first layer formed from an oxide film from which the first semiconductor layer is also formed and a second layer formed on the first layer and containing indium and gallium but not containing tin.

10. The semiconductor device according to claim 1, wherein the conductor region has a sheet resistance of 200Ω/□ or less.

11. The semiconductor device according to claim 1, wherein the metal oxide layer further includes a semiconductor region, and
the semiconductor region is positioned on a periphery of the metal oxide layer.

12. The semiconductor device according to claim 1, wherein the oxide semiconductor layer and the metal oxide layer contain an In—Sn—Zn—O-based oxide.

13. The semiconductor device according to claim 12, wherein the oxide semiconductor layer and the metal oxide layer contain a crystalline portion.

14. A method for manufacturing a semiconductor device including a substrate, a thin-film transistor supported by the substrate, and a capacitive element, the method comprising:
(a) a step of forming, on the substrate, a gate electrode and a gate insulating layer covering the gate electrode;
(b) a step of forming, on the gate insulating layer, an oxide semiconductor film containing indium, tin, and zinc and patterning the oxide semiconductor film to form an active-layer-formation oxide semiconductor layer and an electrode-formation oxide semiconductor layer such that the active-layer-formation oxide semiconductor layer is disposed so as to have at least a portion overlapping the gate electrode with the gate insulating layer therebetween;
(c) a step of forming a source electrode and a drain electrode that are in contact with the active-layer-formation oxide semiconductor layer;
(d) a step of forming a first insulating film so as to cover the source electrode, the drain electrode, and the electrode-formation oxide semiconductor layer, and forming, in the first insulating film, a first opening through which a portion of the drain electrode is exposed, and a second opening through which a portion of the electrode-formation oxide semiconductor layer is exposed;
(e) a step of forming, on the first insulating film and within the first and second openings, a second insulating film having a property of reducing an oxide semiconductor contained in the electrode-formation oxide semiconductor layer, to cause a decrease in a resistance of a portion of the electrode-formation oxide semiconductor layer, the portion being in contact with the second insulating film within the second opening, to form a conductor region while a portion of the electrode-formation oxide semiconductor layer, the portion not being turned into a conductor, remains as a semiconductor region;
(f) a step of removing a portion of the second insulating film, the portion being positioned within the first opening, to form a contact hole that extends through the first and second insulating films and through which the drain electrode is exposed; and
(g) a step of forming a transparent conductive layer on the second insulating film and within the contact hole such that the transparent conductive layer is in contact with the drain electrode within the contact hole and overlaps at least a portion of the conductor region with the second insulating film therebetween.

15. The method for manufacturing a semiconductor device according to claim 14, wherein the step (b) includes a step (b1) of stacking a first semiconductor film containing indium, tin, and zinc, and, on the first semiconductor film, a second semiconductor film containing indium and gallium but not containing tin to obtain an oxide semiconductor film having a multilayer structure.

16. The method for manufacturing a semiconductor device according to claim 15, wherein the step (b) includes
a first patterning step (b2) of patterning, after the step (b1), only the second semiconductor film out of the oxide semiconductor film; and
a second patterning step (b3) of patterning, after the step (b2), the first and second semiconductor films simultaneously.

17. The method for manufacturing a semiconductor device according to claim 16, wherein an etchant used in the step (b2) is phosphoric acid-nitric acid-acetic acid, and an etchant used in the step (b3) is oxalic acid.

18. The method for manufacturing a semiconductor device according to claim 15, wherein the electrode-formation oxide semiconductor layer is formed solely from the first semiconductor film, and the active-layer-formation oxide semiconductor layer is formed from the first and second semiconductor films.

19. The method for manufacturing a semiconductor device according to claim 14, wherein the oxide semiconductor film contains an In—Sn—Zn—O-based oxide.

\* \* \* \* \*